US007016385B2

(12) United States Patent
Watanabe

(10) Patent No.: US 7,016,385 B2
(45) Date of Patent: Mar. 21, 2006

(54) SEMICONDUCTOR LASER DEVICE AND METHOD FOR PRODUCING THE SAME

(75) Inventor: Masanori Watanabe, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 333 days.

(21) Appl. No.: 10/650,047

(22) Filed: Aug. 28, 2003

(65) Prior Publication Data

US 2004/0057486 A1 Mar. 25, 2004

(30) Foreign Application Priority Data

Aug. 29, 2002 (JP) ........................... P2002-251322

(51) Int. Cl.
*H01S 5/00* (2006.01)

(52) U.S. Cl. ............................ 372/44.01; 372/44.013; 372/43.01

(58) Field of Classification Search ............ 372/43.01, 372/44.01, 46.013

See application file for complete search history.

(56) References Cited

U.S. PATENT DOCUMENTS

| | | | | |
|---|---|---|---|---|
| 6,670,202 | B1 * | 12/2003 | Watanabe | 438/20 |
| 6,882,671 | B1 * | 4/2005 | Watanabe | 372/50.1 |
| 2002/0171094 | A1 * | 11/2002 | Koiso et al. | 257/200 |
| 2003/0042492 | A1 | 3/2003 | Watanabe | |
| 2005/0069004 | A1 * | 3/2005 | Watanabe et al. | 372/49 |

FOREIGN PATENT DOCUMENTS

| | | |
|---|---|---|
| JP | 3-153090 | 7/1991 |
| JP | 9-023037 | 1/1997 |
| JP | 9-293928 | 11/1997 |
| JP | 2000-208872 | 7/2000 |
| JP | 2002-094179 | 3/2002 |
| JP | 2003-078204 | 3/2003 |

* cited by examiner

*Primary Examiner*—Minsun Oh Harvey
*Assistant Examiner*—Delma R. Flores-Ruiz
(74) *Attorney, Agent, or Firm*—Morrison & Foerster LLP

(57) ABSTRACT

A semiconductor laser device has a current injection region (A) and current non-injection regions (B) located closer to respective laser beam-emitting end faces than the current injection region is. The semiconductor laser device has an oxide layer (106A) formed at a surface of a p-type $(Al_pHa_{1-p})_qIn_{1-q}P$ ($0 \leqq p \leqq x$, $0 \leqq q \leqq 1$) intermediate band gap layer (106) in each of the current non-injection regions (B), a p-type GaAs cap layer (107) formed on the intermediate band gap layer (106) in the current injection region (A), and a p-type GaAs contact layer (125) formed on the oxide layer (106A) and the p-type GaAs cap layer (107).

16 Claims, 14 Drawing Sheets

SEMICONDUCTOR LASER DEVICE AND METHOD FOR PRODUCING THE SAME

BACKGROUND OF THE INVENTION

The present invention relates to a semiconductor laser device and a method for producing the same, in particular to a semiconductor laser device used for a light source of optical discs and so on, and a method for producing the same.

There has hitherto been an end-face emitting type semiconductor laser device for optical discs. Such a semiconductor laser device is required to generate a high output to write information to an optical disc at a high speed. However, there is a problem that degradation occurs at laser beam-emitting end faces when high-output operation is performed. In order to suppress the degradation at the laser beam-emitting end faces, a structure called "window structure" is generally used. The window structure is formed in regions in proximity of laser beam-emitting end faces of an active layer by intermixing the regions of the active layer (hereinafter these regions are referred to as "window regions"). The window structure is formed in order to broaden the energy band gap of quantum well layers in the window regions and thereby reduce absorption of light in the window regions. Since the window structure is constructed such that absorption of light hardly takes place, it is possible to prevent degradation of the laser beam-emitting end faces due to strong laser beams, and also possible to prevent a reduction in the emission power of laser beams.

Incidentally, in the window structure, if a current flows through the window regions of the active layer, light different from that in an inner region of the active layer is generated, which becomes a factor for degradation of the end faces. Accordingly, in order to prevent a current from flowing through the window regions, it is required that a current non-injection structure be added to the semiconductor laser device.

In order to show an example of a conventional end-face current non-injection structure, the structure of a first semiconductor laser device disclosed in JP-A-03-153090 is shown in FIGS. 10A and 10B. FIG. 10A is a perspective view of the first semiconductor laser device, and FIG. 10B is a cross-sectional view taken along line 10B—10B of FIG. 10A.

With regard to current injection region A of FIG. 10A in the first semiconductor laser device, an n-type GaInP buffer layer 2, an n-type AlGaInP cladding layer 3, a GaInP active layer 4, a p-type AlGaInP cladding layer 5, a p-type GaInP intermediate band gap layer 6, an n-type GaAs block layer 7, and a p-type GaAs contact layer 8 are stacked in this order on an n-type GaAs substrate 1, as shown in FIG. 10B.

On the other hand, in current non-injection regions B of FIG. 10A in the first semiconductor laser device, as seen from a laser beam-emitting end face 50 of FIG. 10A, the p-type GaAs contact layer 8 is directly formed on the p-type AlGaInP cladding layer 5, and the p-type GaInP intermediate band gap layer 6 is eliminated.

With regard to the manner in which a current flows through a semiconductor laser device (voltage-current characteristic), comparison was made between a semiconductor laser device which is made of only the current injection region A and a semiconductor laser device which is made of only the current non-injection region B. The results thereof are shown in FIG. 11. In FIG. 11, solid line A indicates the voltage-current characteristic of the semiconductor laser device made of only the current injection region A and broken line B indicates the voltage-current characteristic of the semiconductor laser device made of only the current injection region B. When a voltage of 2.5 V is applied, a current flows through the semiconductor laser device made of only the current injection region A, as shown by solid line A in FIG. 11, while a current does not flow through the semiconductor laser device made of only the current non-injection region B.

Using FIGS. 12A and 12B, a phenomenon that a current hardly flows at a junction interface between semiconductor layers will be described. In FIGS. 12A and 12B, the horizontal axis shows a distance from the p-type AlGaInP cladding layer 5 to the p-type GaAs contact layer 8 (in a direction perpendicular to the n-type GaAs substrate 1), while the vertical axis shows an energy level of the semiconductor laser device. FIG. 12A refers to the current injection region A and FIG. 12B refers to the current non-injection region B. In FIG. 12, Ec shows an energy level of the conduction band (electrons), Ev shows an energy level of the valence band (holes), and a difference between Ec and Ev shows an energy band gap.

In the first semiconductor laser device, the p-type GaInP intermediate band gap layer 6, which has an energy level intermediate between the levels of the p-type AlGaInP cladding layer 5 and the p-type GaAs contact layer 8, is provided in the current injection region A. Therefore, as shown in FIG. 12A, energy barriers $\Delta E_{a1}$ and $\Delta E_{a2}$, which are generated due to a difference between energy band gaps can be reduced and thus flow of current (holes) can be made smooth.

On the other hand, in the first semiconductor laser device, because the p-type AlGaInP cladding layer 5 is in direct contact with the p-type GaAs contact layer 8, an energy barrier $\Delta E_b$ generated due to a difference between energy band gaps can be made large. Thus, flow of current (holes) can be prevented. In this manner, the first semiconductor laser device prevents a current from flowing through the window regions.

However, when producing the first semiconductor laser device, a process of selectively removing only the p-type GaInP intermediate band gap layer 6 in proximity of laser beam-emitting end faces is required in order to form current non-injection regions. This process has a problem, which will be described below using FIGS. 13A and 13B. FIGS. 13A and 13B are schematic cross-sectional views showing the conventional current non-injection region.

In the first semiconductor laser device, a p-type GaInP intermediate band gap layer 41 shown in FIG. 13A is usually removed by wet etching. In the case where a liquid containing bromine, which is a typical etchant, is used, a p-type AlGaInP cladding layer 42 shown in FIG. 13A is also etched. Thus, as shown in FIG. 13B, the thickness of the p-type AlGaInP cladding layer 42 is reduced in the current non-injection region. Because laser beams spread to an upper end portion of the p-type AlGaInP cladding layer 42, the reduction in the thickness of the p-type AlGaInP cladding layer 42 deteriorates the function of confining laser beams in an active layer, which causes absorption of light, resulting in deterioration of emission power.

Further, in the case where a so-called real guide structure, which reduces absorption of light, is constructed by replacing the n-type GaAs block layer 7 of the first semiconductor laser device shown in FIG. 10A and FIG. 10B with an n-type AlInP block layer, there is also a problem that in a process step of etching the p-type GaInP intermediate band gap layer 41, both the n-type AlInP block layer 133 and the p-type AlGaInP cladding layer 132 forming a ridge are also etched.

Describing this in more detail, when the real guide structure is adopted, because the n-type AlInP block layer 43 is easy to etch in the vicinity of ridge side surfaces 42*a* (see FIG. 13A) of the p-type AlGaInP cladding layer 42 where the n-type AlInP block layer 43 has crystal quality different from that on a flat surface, the ridge of the p-type AlInP cladding layer 132 and a boundary surface of the n-type AlInP block layer 133 are curved and deformed, as shown in FIG. 13B. Consequently, light is easily absorbed in the vicinity of the laser beam-emitting end faces of the semiconductor laser device. In FIG. 13B, reference numeral 45 indicates a portion of the n-type AlInP block layer to be etched in the process of etching the p-type GaInP intermediate band gap layer 41, while reference numeral 46 indicates a portion of the p-type AlGaInP cladding layer to be etched in the process step of etching the p-type GaInP intermediate band gap layer 41.

A second semiconductor laser device disclosed in JP-A-9-293928, which is shown in FIG. 14, has the following problem.

In the second semiconductor laser device, an n-type AlGaInP cladding layer 22, an active layer 23, a p-type AlGaInP cladding layer 24, a p-type GaInP layer are stacked in this order on a substrate 21. Then, a series of process steps for intermixing portions in proximity of laser beam-emitting end faces of the active layer 23 (details of which are herein omitted) is conducted. Furthermore, window structures 30 having an increased band gap are formed in the vicinity of the laser beam-emitting end faces of the active layer 23. In the second semiconductor laser device, after the window structures 30 are formed, a ridge, a current blocking layer 26, and a contact layer 32 are formed. Then, for the purpose of preventing a reactive current from flowing through the window regions, resistance-increased proton-injected regions 33 are formed in the contact layer 32 on the sides of the laser beam-emitting end faces by proton injection method.

In the second semiconductor laser device, the proton injection method is used, but injection of protons causes defects in crystals. Thus, there is a problem that crystal defects increase during the operation of the semiconductor laser device, resulting in deterioration of the semiconductor laser device. On the other hand, if protons having a weak energy are injected in order to suppress the deterioration of the semiconductor laser device, the sufficient current non-injection effect cannot be achieved.

SUMMARY OF THE INVENTION

An object of the present invention is to provide a semiconductor laser device and a method for producing the same, which can prevent degradation of emitting end faces and suppress absorption of laser beams in proximity of the emitting end faces to thereby suppress reduction in the emission power.

In order to achieve the above object, in a semiconductor laser device according to the present invention, an n-type $(Al_eHa_{1-e})_fIn_{1-f}P$ ($0 \leqq e \leqq 1$, $0<f<1$) cladding layer, an active layer comprising a plurality of stacked layers of AlGaInP type material, a p-type $(Al_xHa_{1-x})_yIn_{3-y}P$ ($0 \leqq x \leqq 1$, $0 \leqq y \leqq 1$) cladding layer, and a p-type $(Al_pHa_{1-p})_qIn_{1-q}P$ ($0<p \leqq x$, $0 \leqq q \leqq 1$) intermediate band gap layer are stacked in this order on a substrate. The semiconductor laser device has a current injection region and a current non-injection region. Further, the semiconductor laser device includes an oxide layer formed on a surface of the p-type $(AlpGa_{1-p})_qIn_{1-q}P$ intermediate band gap layer in the current non-injection region, a p-type $Al_yHa_{1-y}As$ ($0 \leqq u \leqq 1$) cap layer formed on the p-type $(Al_pHa_{1-p})_qIn_{1-q}P$ intermediate band gap layer in the current injection region, and a p-type $Al_xHa_{1-v}As$ ($0 \leqq v \leqq 1$) contact layer formed on the oxide layer and the p-type $Al_uHa_{1-u}As$ cap layer.

In this specification, $(Al_xHa_{1-x})_yIn_{1-y}P$ ($0 \leqq x \leqq 1$, $0 \leqq y \leqq 1$), $Ha_yIn_{1-y}P$ ($0 \leqq y \leqq 1$) and $Al_xHa_{1-x}As$ ($0 \leqq x \leqq 1$) are also referred to as AlGaInP, GaInP and AlGaAs, respectively. It is true with the other molar fractions e, f, p, q, u and v.

The values of e, f, x, y, p, q, u and v representing the molar fractions in the respective layers may vary in the depth direction in the same layer.

The p-type $(Al_xHa_{1-x})_yIn_{1-y}P$ cladding layer may be formed by stacking, for example, a p-type $(Al_{0.7}Ha_{0.3})_{0.5}In_{0.5}P$ first upper cladding layer and a p-type $(Al_{0.7}Ha_{0.3})_{0.5}In_{0.5}P$ second upper cladding layer in order. However, in the case where the p-type $(Al_xHa_{1-x})_yIn_{1-y}P$ cladding layer is composed of a plurality of layers as above, the value of x, which is an upper limit of the value of the molar fraction p in the p-type $(Al_pHa_{1-p})_qIn_{1-q}P$ ($0 \leqq p \leqq x$, $0 \leqq q \leqq 1$) intermediate band gap layer, can be defined as a value of x in a portion of the p-type $(Al_xHa_{1-x})_yIn_{1-y}P$ cladding layer immediately on which the p-type $(Al_pHa_{1-p})_qIn_{1-q}P$ intermediate band gap layer is laid (in the above example, the value of x is 0.7).

According to the semiconductor laser device of this invention, the oxide layer is present on a surface of the p-type $(Al_pHa_{1-p})_qIn_{1-q}P$ intermediate band gap layer in the current non-injection region. Thus, even if the p-type AlGaInP intermediate band gap layer is not removed, the current non-injection region has favorable current non-injection characteristics. Different from the conventional semiconductor laser device in which the p-type AlGaInP intermediate band gap layer in the current non-injection region is etched so that the p-type AlGaInP cladding layer is etched simultaneously, since the p-type GaInP intermediate band gap layer can be left without being etched even in the current non-injection region, the p-type AlGaInP cladding layer is not etched and the thickness of the p-type AlGaInP cladding layer is not reduced in the current non-injection region. Consequently, the function of confining laser beams in the active layer does not deteriorate. Thus, if such a current non-injection region is provided at and near a laser beam-emitting end face, it is possible to suppress absorption of laser light at and near the end face to thereby prevent decrease of the emission output power.

According to the semiconductor laser device of the invention, the p-type GaInP intermediate band gap layer is left in the current non-injection region and thus the p-type AlGaInP cladding layer forming the ridge is not etched. Thus, the ridge shape of the p-type AlGaInP cladding layer is not curved or deformed, so that the ridge shape can be retained in the intended shape. Consequently, if the current non-injection region is provided at and near a laser beam-emitting end face, it is possible to suppress absorption of laser light at and near the emitting end face and thereby prevent decrease of the laser emission power.

The current non-injection region of the semiconductor laser device of the invention is formed without using the proton injection technique. Thus, it is possible to prevent the occurrence of defects in crystals of the semiconductor laser device.

In one embodiment, the oxide layer has an oxygen concentration that is higher than an oxygen concentration at an interface between the p-type $(Al_pHa_{1-p})_qIn_{1-q}P$ intermediate band gap layer in the current injection region and the p-type $(Al_uHa_{1-u})As$ cap layer and that is also higher than an oxygen concentration at an interface between the p-type $(Al_uHa_{1-u})As$ cap layer and the p-type $Al_vHa_{1-v}As$ contact layer.

According to the above embodiment, a flow of current at the interface between the p-type $(Al_pHa_{1-p})_qIn_{1-q}P$ intermediate band gap layer and the p-type $Al_vHa_{1-v}As$ contact layer in the current non-injection region is smaller than a flow of current at the interface between the p-type $(Al_pHa_{1-p})_qIn_{1-q}P$ intermediate band gap layer and the p-type $Al_vHa_{1-v}As$ contact layer in the current injection region and also than a flow of current at the interface between the p-type $(Al_pHa_{1-p})_qIn_{1-q}P$ intermediate band gap layer and the p-type $Al_uHa_{1-u}As$ cap layer in the current injection region. The flow of current at the interface between the p-type $(Al_pHa_{1-p})_qIn_{1-q}P$ intermediate band gap layer and the p-type $Al_vHa_{1-v}As$ contact layer in the current non-injection region is thus prevented, whereby a large current non-injection effect is obtained.

Experiments conducted by the inventor of the present invention have proved that, if the oxide layer has an oxygen concentration of $1\times10^{20}$ $cm^{-1}$ or more, (preferably $3\times10^{20}$ $cm^{-3}$ or more), the oxide layer sufficiently prevents a current from flowing through the p-type AlGaInP intermediate band gap layer. Therefore, by forming the oxide layer having an oxygen concentration of $1\times10^{20}$ $cm^{-3}$ or more at the interface between the p-type AlGaInP intermediate band gap layer in the current non-injection region and the p-type AlGaAs contact layer, a sufficient current non-injection effect can be obtained.

Also, experiments conducted by the inventor of the present invention have proved that if the oxygen concentration at the interface between the p-type $(Al_pHa_{1-p})_qIn_{1-q}P$ intermediate band gap layer and the p-type $Al_uHa_{1-u}As$ cap layer and the oxygen concentration at the interface between the p-type $Al_uHa_{1-u}As$ cap layer and the p-type $Al_vHa_{1-v}As$ contact layer are both $1\times10^{19}$ $cm^{-3}$ or less, (preferably $3\times10^{18}$ $cm^{-3}$ or less), a current can easily pass through the interface having the above oxygen concentration. Accordingly, it is possible to supply a sufficient current to the current injection region which requires to be fed with a current in order to generate laser beams.

In one embodiment, the p-type $(Al_pHa_{1-p})_qIn_{1-q}P$ intermediate band gap layer satisfies a condition of $0<p\leqq0.1$.

If the intermediate band gap layer contains no Al constituent, film formability and etching controllability increases, while interface oxidation is not easy. However, according to the above embodiment, since the Al molar fraction, p, in the p-type $(Al_pHa_{1-p})_qIn_{1-q}P$ intermediate band gap layer is not more than 0.1, favorable film formability and controllability at the time of etching can be maintained, and yet there is an improved effect of easily forming oxide at an interface. If the Al molar fraction, p, of the p-type $(Al_pHa_{1-p})_qIn_{1-q}P$ intermediate band gap layer is more than 0.4, it becomes difficult to maintain favorable film-forming properties and controllability at the time of etching.

In one embodiment, the current non-injection region is located closer to a laser-beam emitting end face than the current injection region is, and a region of the active layer corresponding to the current non-injection region is intermixed at least at a portion on the side of the laser beam-emitting end face.

According to the above embodiment, a window region having a minimum value of the band gap energy larger than a maximum value of that of a non-intermixed active layer region is formed at least at a portion of the active layer on the side of the laser beam-emitting end face. Because the window region is structured such that light is hardly absorbed because of a wide energy band gap, it is possible to increase a maximum optical power, as well as preventing the switching phenomenon of the current-optical output characteristics, which would occur when a current non-injection structure is used without providing a window region. The increase of noise can also be prevented. Accordingly, the semiconductor laser device of this embodiment can be applied as a semiconductor laser device for optical discs that can perform both high- and low-output operations.

In a method for producing the semiconductor laser device according to the present invention, in an intermediate band gap layer and cap layer forming process, a p-type $(Al_pHa_{1-p})_qIn_{1-q}P$ $(0\leqq p\leqq x, 0\leqq q\leqq1)$ intermediate band gap layer and a p-type $(Al_uHa_{1-u})As$ $(0\leqq u\leqq1)$ cap layer are sequentially formed in a film-forming apparatus. Thereafter, in a cap layer removing process, in order to form a current non-injection region, a portion to serve as the current non-injection region later is removed from the p-type $(Al_uHa_{1-u})As$ cap layer. Then, in a subsequent oxide layer forming process, an oxide layer is formed at a surface of the p-type $(Al_pHa_{1-p})_qIn_{1-q}P$ intermediate band gap layer exposed due to the partial removal of the p-type $(Al_uHa_{1-u})As$ $(0\leqq u\leqq1)$ cap layer in the cap layer removing process. Then, in a contact layer forming process, a p-type $Al_vHa_{1-v}As$ $(0\leqq v\leqq1)$ contact layer is formed on the p-type $(Al_uHa_{1-u})As$ cap layer in the current injection region and on the oxide layer in the current non-injection region.

According to the method for producing the semiconductor laser device, in the oxide layer forming process following the cap layer removing process, the oxide layer is formed on the surface of the p-type AlGaInP intermediate band gap layer which has been exposed by the cap layer removing process, whereby the current non-injection region can appropriately be formed. The oxide layer surely prevents a current from flowing through the current non-injection region, securing favorable current non-injection characteristics in the current non-injection region.

According to the method for producing the semiconductor laser device of the invention, a favorable interface that has continuously grown can be formed in the current injection region where the cap layer has not been removed in the cap layer removing process. Thus, a current is allowed to flow through the current injection layer at a low voltage. Consequently, favorable current injection characteristics in the current injection region can be secured.

In one embodiment, the p-type $Al_vGa_{1-v}As$ contact layer is formed by molecular beam epitaxy.

According to this embodiment, reducing gas such as hydrogen is not used. Thus, the oxide layer can surely be formed on the p-type $(Al_pGa_{1-p})_qIn_{1-q}P$ intermediate band gap layer even in a state in which the substrate temperature is low.

In one embodiment, before forming the p-type $Al_vGa_{1-v}As$ contact layer, the surface of the p-type $(AlpGa_{1-p})_qIn_{1-q}P$ intermediate band gap layer is oxidize solution containing hydrogen peroxide.

According to this embodiment, the oxide layer can be formed by a simple treatment of immersion into the solution, so that formation of the current non-injection region can surely be realized.

In one embodiment, before forming the p-type $Al_vGa_{1-v}As$ contact layer, the surface of the p-type $(Al_pGa_{1-p})_qIn_{1-q}P$ intermediate band gap layer is oxidized by being exposed to an atmosphere of at least one of ozone, oxygen ion or activated oxygen.

According to this embodiment, the oxide layer can be formed by the simple treatment of exposure to an atmosphere of oxidizing gas, so that formation of the current non-injection region can surely be realized.

In one embodiment, before forming the p-type $Al_vGa_{1-v}As$ contact layer, the surface of the p-type $(Al_pGa_{1-p})_qIn_{1-q}P$ intermediate band gap layer is oxidized by being exposed to a gas containing water vapor.

According to this embodiment, the oxide layer can be formed by the simple treatment of exposure to a gas atmosphere, which contains water vapor, so that formation of the current non-injection region can surely be achieved.

In one embodiment, the p-type $Al_vGa_{1-v}As$ contact layer is formed by metal-organic chemical vapor deposition method.

According to this embodiment, in spite that the p-type AlGaAs contact layer is formed by the metal-organic chemical vapor deposition method (MOCVD method) that uses a reducing gas, hydrogen, an oxide layer having favorable current non-injection characteristics can be formed by a combination of the MOCVD method with a surface oxidation method using a hydrogen peroxide solution, or by changing the conditions (the substrate temperature, etc.) when performing the MOCVD method.

In one embodiment, before forming the p-type $Al_vGa_{1-v}As$ contact layer, the surface of the p-type $(Al_pGa_{1-p})_qIn_{1-q}P$ intermediate band gap layer is oxidized using a solution containing hydrogen peroxide.

According to this embodiment, the oxide layer can be formed by the simple treatment of immersion into the solution, so that formation of the current non-injection regions can surely be achieved.

In one embodiment, before forming the p-type $Al_vGa_{1-v}As$ contact layer, the surface of the p-type $(Al_pGa_{1-p})_qIn_{1-q}P$ intermediate band gap layer is oxidized by being exposed to an atmosphere of at least one of ozone, oxygen ion or activated oxygen.

According to this embodiment, the oxide layer can be formed by the simple treatment of exposure to an atmosphere of oxidizing gas, so that formation of the current non-injection region can surely be achieved.

In one embodiment, before forming the p-type $Al_vGa_{1-v}As$ contact layer, the surface of the p-type $(Al_pGa_{1-p})_qIn_{1-q}P$ intermediate band gap layer is oxidized by being exposed to a gas containing water vapor.

According to this embodiment, the oxide layer can be formed by the simple treatment of exposure to a gaseous atmosphere containing water vapor, whereby formation of the current non-injection regions can surely be achieved.

The present invention is applicable whether the current non-injection region is formed in the vicinity of a laser beam-emitting end surface or in other locations.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The present invention will hereinafter be described in more detail by way of examples illustrated.

In the following embodiments, $(Al_xGa_{1-x})_yIn_{1-y}P$ ($0 \leqq x \leqq 1$, $0 \leqq y \leqq 1$), $Ga_yIn_{1-y}P$ ($0 \leqq y \leqq 1$) and $Al_xGa_{1-x}As$ ($0 \leqq x \leqq 1$) are also referred to as AlGaInP, GaInP and AlGaAs, respectively.

First Embodiment

FIG. 1A through FIG. 2C are perspective views showing a process for producing a semiconductor laser device according to a first embodiment of the present invention. It should be noted that these figures show only a part corresponding to a single chip of the entire wafer for the sake of convenience.

The semiconductor laser device and the method for producing the same according to the first embodiment will be described below.

Figure 1A:
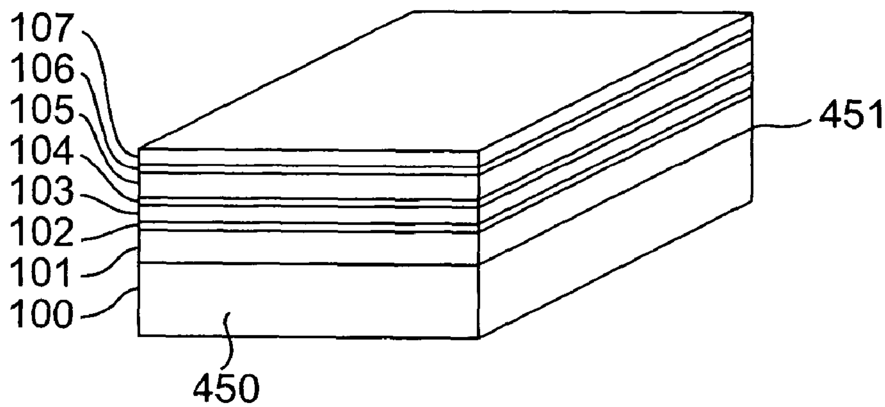
FIGS. 1A–1C are views for explaining a method for producing a semiconductor laser device according to a first embodiment of the present invention.

First, as shown in FIG. 1A, an n-type $(Al_{0.7}Ga_{0.3})_{0.5}In_{0.5}P$ lower cladding layer 101 (having a thickness of 1.5 $\mu$m and a carrier concentration of $1\times10^{18}$ $cm^{-3}$), an active layer 102 consisting of four undoped $(Al_{0.5}Ga_{0.5})_{0.5}In_{0.5}P$ layers and three undoped GaInP layers (having a thickness of 6 nm) respectively interposed between the adjacent undoped $(Al_{0.5}Ga_{0.5})_{0.5}In_{0.5}P$ layers, a p-type $(Al_{0.7}Ga_{0.3})_{0.5}In_{0.5}P$ first upper cladding layer 103 (having a thickness of 0.2 $\mu$m, and a carrier concentration of $1.0\times10^{18}$ $cm^{-3}$), a p-type $Ga_{0.6}In_{0.4}P$ etching stopper layer 104 (having a thickness of 8 nm, a carrier concentration of $1.0\times10^{18}$ $cm^{-3}$), a p-type $(Al_{0.7}Ga_{0.3})_{0.5}In_{0.5}P$ second upper cladding layer 105 (having a thickness of 0.8 μm, and a carrier concentration of $1.3\times10^{18}$ $cm^{-3}$), a p-type GaInP intermediate band gap layer 106 (having a thickness of 0.1 μm, and a carrier concentration of $3\times10^{18}$ $cm^{-3}$), and a p-type GaAs cap layer 107 (having a thickness of 0.3 μm, and a carrier concentration of $10\times10^{18}$ $cm^{-3}$) are sequentially formed in this order on an n-type GaAs substrate 100 by a molecular beam epitaxy method (hereinafter referred to as MBE method).

The process of forming the p-type GaInP intermediate band gap layer 106 (0.1 μm, $3\times10^{18}$ $cm^{-3}$) and the p-type GaAs cap layer 107 (0.3 μm, $3\times10^{18}$ $cm^{-3}$) on the p-type $(Al_{0.7}Ga_{0.3})_{0.5}In_{0.5}P$ second upper cladding layer 105 is one example of the intermediate band gap layer and cap layer forming process.

In the semiconductor laser device according to this first embodiment, n-type dopant is Si, and p-type dopant is Be.

Figure 1B:
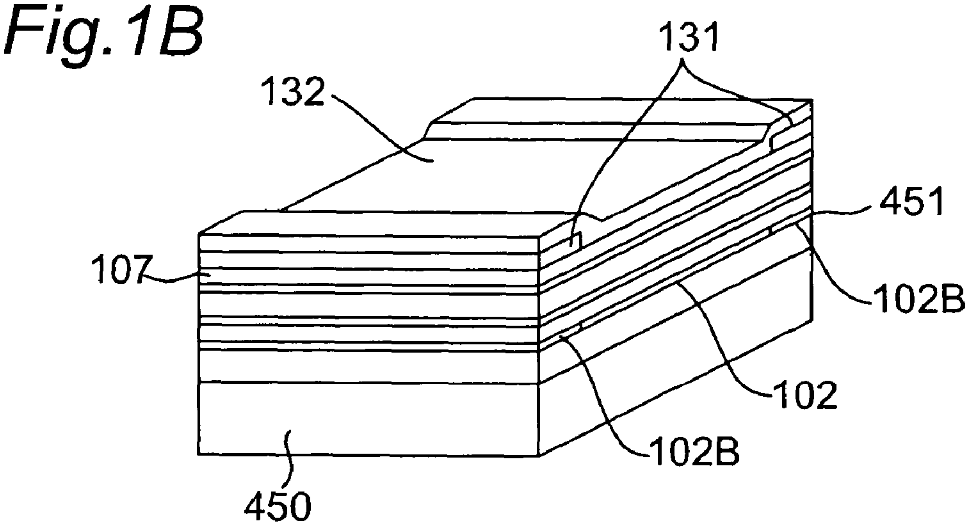

Next, as shown in FIG. 1B, a ZnO (zinc oxide) layer 131 is formed in stripes along regions forming laser beam-emitting end faces 450, 451 on the cap layer 107, and a $SiO_2$ (silicon oxide) layer 132 is formed on the entire regions of the cap layer 107 and of the ZnO layer 131.

Then, annealing is performed at 520° C. for 2 hours, so that Zn is diffused from the ZnO layers 131 to regions of the cap layer 107 and the upper cladding layer 105 on the sides of the laser beam-emitting end faces 450, 451. Thereby, intermixing of quantum well layers and barrier layers of the active layer 102 under the ZnO layers 131 is performed to form window regions 102B of the active layer 102. In the semiconductor laser device according to the first embodiment, the ZnO stripes 131 are formed so as to have a width of 30 μm as measured from the portions that are to become a laser beam-emitting surface (front end face) 450 and a laser beam-reflecting surface (rear face) 451.

Figure 1C:
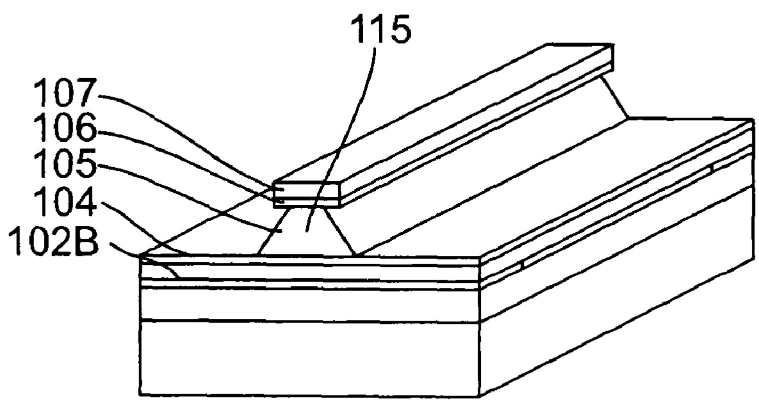

Subsequently, as shown in FIG. 1C, after removing the $SiO_2$ layer 132 and the ZnO layers 131 with a buffered hydrofluoric acid, the p-type GaAs cap layer 107, the p-type GaInP intermediate band gap layer 106 and the p-type $(Al_{0.7}Ga_{0.3})_{0.5}In_{0.5}P$ second upper cladding layer 105 are etched in a stripe shape until the etching stopper layer 104 is exposed, whereby a ridge stripe 115 is formed.

Figure 2A:
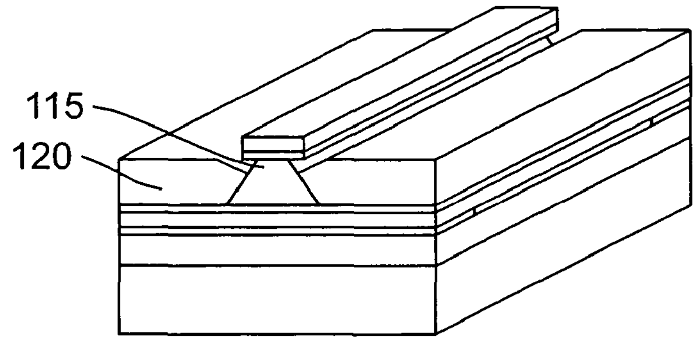
FIGS. 2A–2C are views for explaining the method for producing the semiconductor laser device, showing process steps following a step shown in FIG. 1C.

Next, as shown in FIG. 2A, an n-type $Al_{0.5}In_{0.5}P$ current blocking layer 120 is formed on the etching stopper layer 104 by the MBE method in a manner so as to be in contact with side surfaces of the ridge stripe portion 115.

Figure 2B:
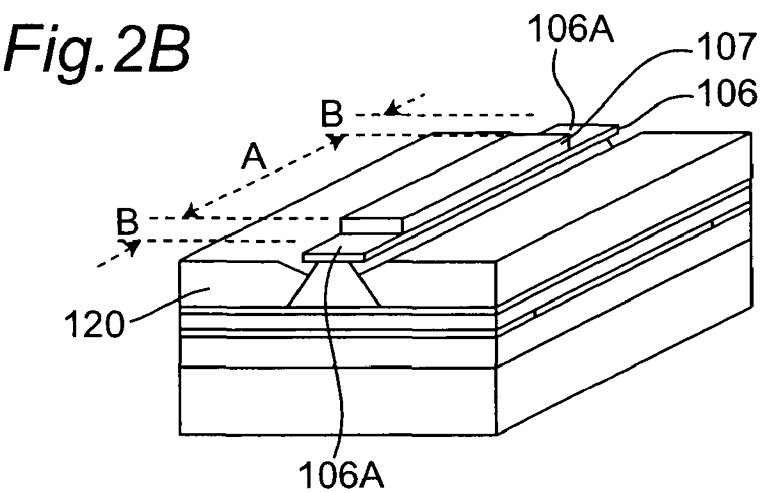

Then, as shown in FIG. 2B, a cap layer removing process and an oxide layer forming process are conducted. Specifically, current injection region A (a region at a distance of 30 μm or more from either emitting end face) is covered by a resist (not shown), and current non-injection regions B (regions each having a distance of less than 30 μm from the corresponding emitting end face) are subjected to etching with a mixed solution containing ammonia, hydrogen peroxide and water at a ratio of 20:30:50 and having a temperature of 20° C. for 30 seconds, whereby portions of the p-type GaAs cap layer 107 in the current non-injection regions B, which are not covered by the resist, are removed. At this time, a surface of the p-type GaInP intermediate band gap layer 106, which is exposed due to removal of the portions of the p-type GaAs cap layer 107 not having been covered, is not etched, but is oxidized due to the action of hydrogen peroxide solution. Thereby, the oxide layer 106A is formed on the exposed surface of the p-type GaInP intermediate band gap layer. In the cap layer-removing process and the oxide layer-forming process, the n-type $Al_{0.5}In_{0.5}P$ current blocking layers 120 are not etched by the etchant and thus their shapes are retained.

Figure 2C:
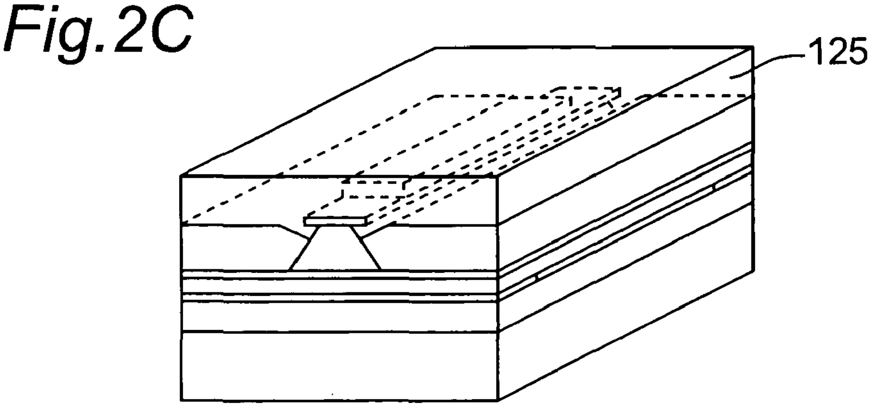

Then, a contact layer forming process shown in FIG. 2C is conducted. Specifically, by the MBE method, a p-type GaAs contact layer 125 (having a thickness of 4 μm) is formed on the p-type $Al_uGa_{1-u}As$ cap layer not removed in the cap layer removing process and the oxide layers 106A formed in the oxide layer forming process in a manner so as to cover the entire surface of the wafer. At this time, the substrate temperature is 620° C. With this substrate temperature, a certain amount of oxygen on the p-type GaInP intermediate band gap layer 106 will remain without being removed.

Figure 3:
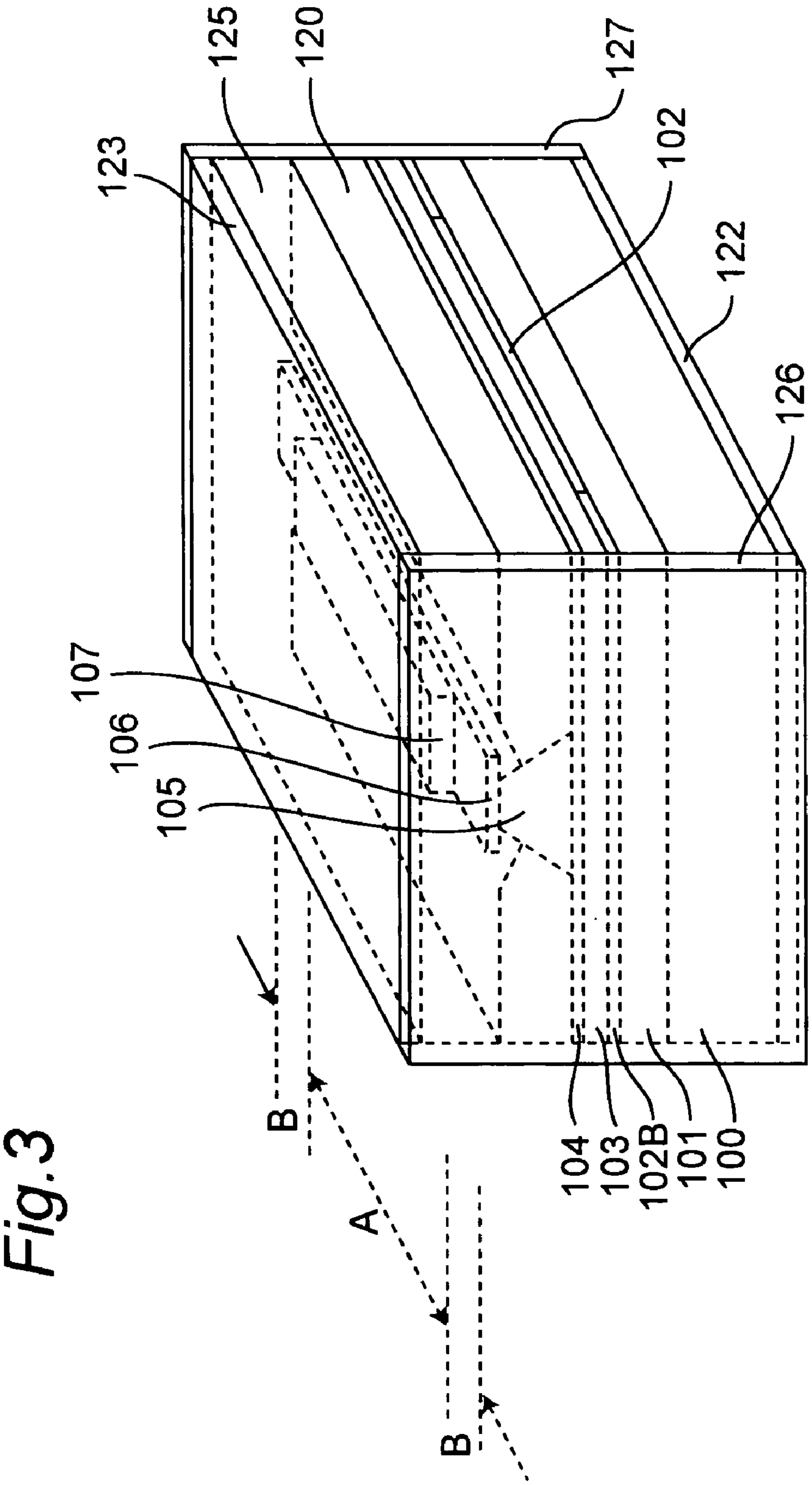
FIG. 3 is a perspective view of the semiconductor laser device produced by the method according to the first embodiment of the present invention.

Subsequently, as shown in FIG. 3, an n-side electrode 122 and a p-side electrode 123 are formed, and the wafer is cleaved at window regions so as to have a resonator length of 900 μm. A laser beam-emitting end face is coated with a low-reflectivity reflection coating 126 with a reflectivity of about 6%, while the end face opposite from the laser beam-emitting end face is coated with a high-reflectivity reflection coating 127 with a reflectivity of about 90% to complete the semiconductor laser device according to the first embodiment. In FIG. 3, the same layers as those in FIGS. 1 and 2 are designated by the same reference numerals.

The semiconductor laser device oscillated at a wavelength of 658 nm, and generated a CW (continuous wave) maximum output power of 165 mW. In operation at a pulse of 100 mW, 70° C. (pulse width: 100 ns, duty: 50%), an average lifetime of 5000 hours or more was achieved. In a comparative semiconductor laser device in which the current non-injection structure is provided but the window structure is omitted, a CW maximum output of 132 mW was obtained. However, a switching phenomenon of current/optical output characteristics occurs at a current approximate to an oscillation current threshold, and noise at the time of low-output operation increased. The low-output operation becomes unstable when the switching phenomenon occurs. Thus, such a semiconductor laser device is not suited as a laser for optical disks that performs a high-output operation when writing and a low-output operation when reading, although the semiconductor laser device can be used as a laser for optical disks that performs the high-output operation only.

Next, in order to confirm the effect of the current non-injection structure of the semiconductor laser device according to the first embodiment, measurement of oxygen density in a direction perpendicular to the substrate of the semiconductor laser device was conducted by secondary ion mass spectroscopy (SIMS).

Figure 4:
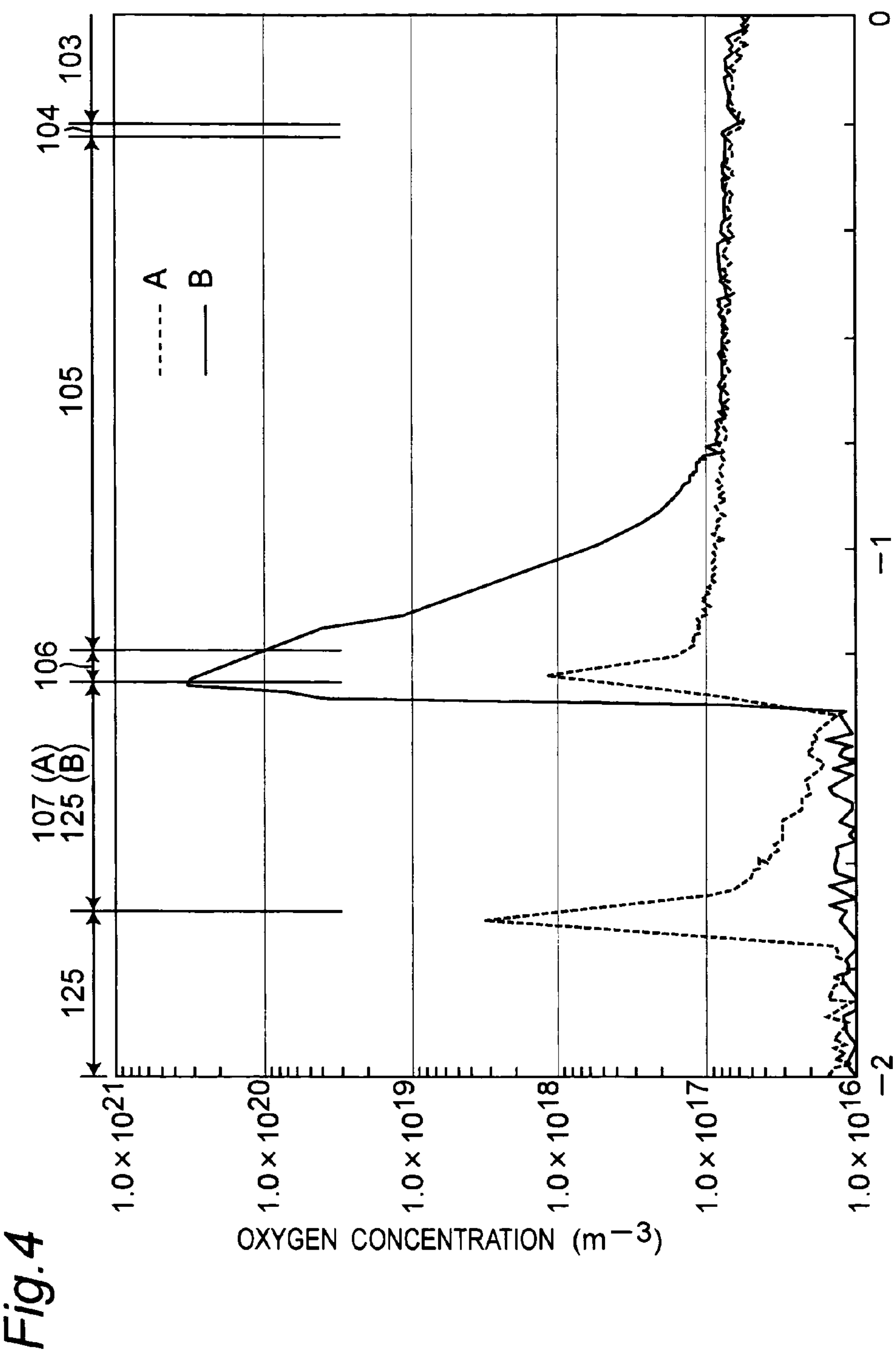
FIG. 4 is a graph showing the oxygen concentration in current injection region A and that in current non-injection regions B of the semiconductor laser device according to the first embodiment.

FIG. 4 depicts measurement results of those portions corresponding to the current injection region A and the current non-injection region B when the ridge width was as wide as 900 μm. In the current non-injection regions B indicated in a solid line, an interface having a large oxygen density of about $3\times10^{20}$ $cm^{-3}$ is present between the p-type GaInP intermediate band gap layer 106 and the cap layer 107, and the interface prevent an electric current from permeating deep into the current non-injection region B. On the other hand, the maximum oxygen concentration of an interface in the current injection region A indicated in a dotted line in FIG. 4 is provided by an oxygen density at an interface between the cap layer 107 and the contact layer 125, which is $3\times10^{18}$ $cm^{-3}$ at the utmost. Therefore, in the current injection region A, the interface having the role of blocking an electric current is low, so that the current smoothly flows.

Figure 5:
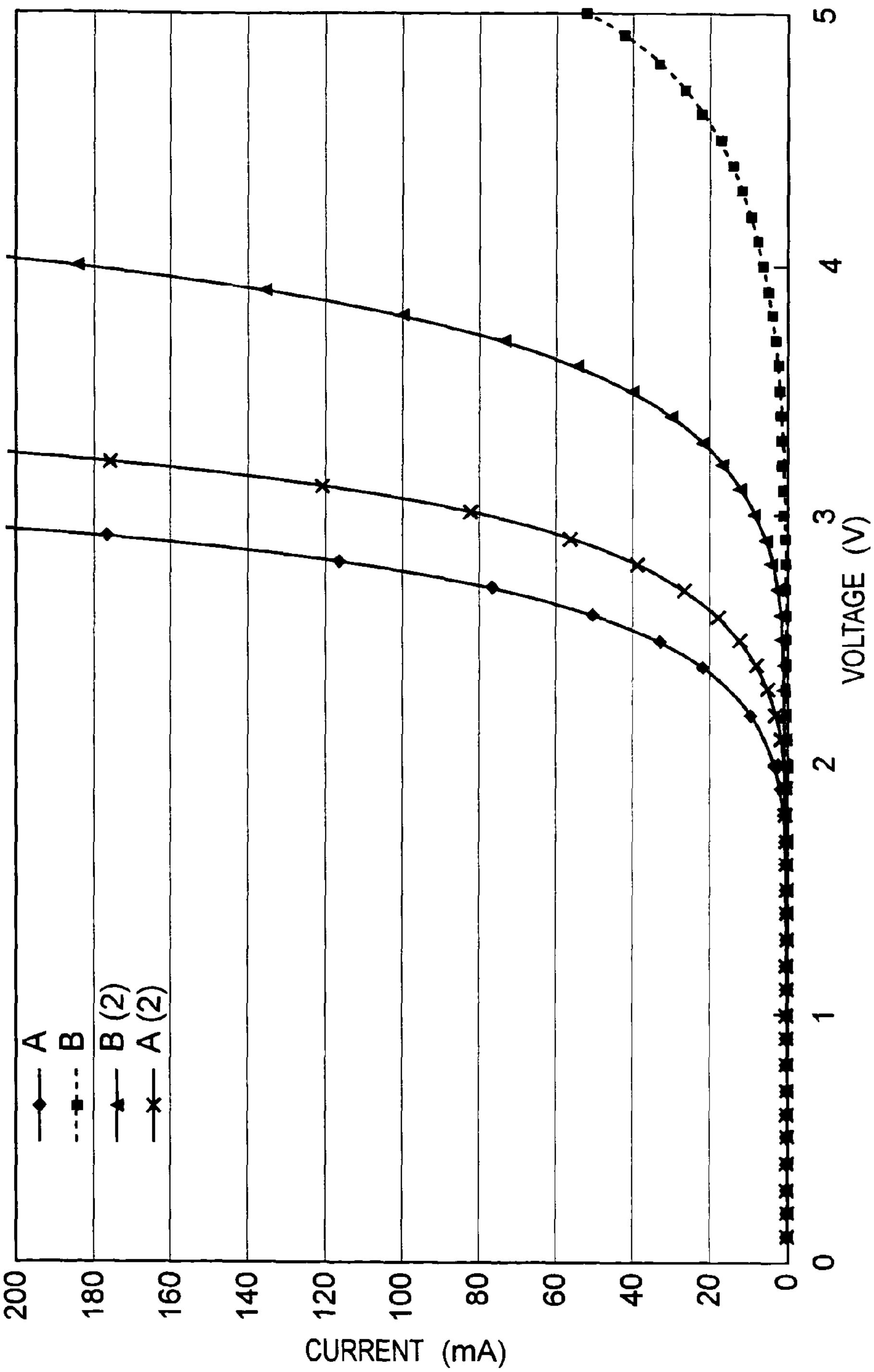
FIG. 5 is a graph showing the voltage-current characteristics of the semiconductor laser device according to the first embodiment.

Further, in order to confirm the effect of the current non-injection structure of the semiconductor laser device, a semiconductor laser device in which a 900 μm long resonator is entirely made of only the current injection region A, and a semiconductor laser device in which a 900 μm long resonator is entirely made of only the current non-injection region B were fabricated and the voltage-current characteristics of these semiconductor laser devices were measured. FIG. 5 shows the voltage-current characteristics of these semiconductor laser devices. As shown in FIG. 5, the semiconductor laser device made of only the current injection region A had an operation voltage of 2.9 V when an electric current of 177 mA flowed, while the semiconductor laser device made of only the current non-injection region B required an operation voltage of as mush as 4.2 V in order for an electric current of only 10 mA to flow. It turns out that a favorable current non-injection structure has been formed in the semiconductor laser device which is made of only the current non-injection region B.

A curve B(2) depicted in FIG. 5 shows the voltage-current characteristics of a semiconductor laser device wherein formation conditions of the p-type contact layer were changed so that the oxygen concentration at the interface between the p-type GaInP intermediate band gap layer and the cap layer in the current non-injection region B was $1\times10^{20}$ $cm^{-1}$ as measured by secondary ion mass spectroscopy. The current of this semiconductor laser device was as small as 9 mA at 3V, which proves that the semiconductor laser device has a sufficient current non-injection effect.

A curve A(2) depicted in FIG. 5 shows the voltage-current characteristics of a semiconductor laser device wherein formation conditions of the p-type contact layer were changed so that in the current injection region A, the oxygen concentration at the interface between the cap layer and the contact layer, and the oxygen concentration at the interface between the intermediate band gap layer and the cap layer were $1\times10^{19}$ $cm^{-3}$ as measured by secondary ion mass spectroscopy. In this semiconductor laser device, it was at a voltage of 3.2 V when an operation current of 176 mA that generates an optical output of 100 mW flowed. This satisfies the condition of the operation voltage of not more than 3.3 V at which the semiconductor laser device can be used as a product.

According to the semiconductor laser device of the first embodiment, since the oxide layers 106A are formed in the current non-injection regions B on the sides of the laser beam-emitting end faces on the surface of the p-type GaInP intermediate band gap layer 106, the sufficient current non-injection effect can be obtained even if the p-type GaInP intermediate band gap layer 106 in the current non-injection regions B is not removed. Therefore, the p-type GaInP intermediate band gap layer 106 can be left without being removed from the current non-injection regions B. Thus, different from a conventional semiconductor laser device, when etching the p-type GaInP intermediate band gap layer in the current non-injection regions, the p-type Al GaInP cladding layer is not etched together therewith, thus making it possible to maintain the designed thickness of the p-type AlGaInP upper cladding layer 105 in the current non-injection regions B. Accordingly, the function to confine laser beams in the active layer 102 is prevented from deteriorating, thus making it possible to suppress the absorption of light in the vicinity of the emitting end faces to thereby prevent degradation of the emission power of laser beams.

Since the p-type GaInP intermediate band gap layer 106 remains without being removed in the current non-injection regions B, the p-type AlGaInP upper cladding layer 105, which forms the ridge, is not etched. Thus, the ridge shape of the p-type AlGaInP upper cladding layer 105 is not curved or deformed and the ridge shape can be maintained in the intended shape, which makes it possible to prevent degradation of the emission output of laser beams while suppressing absorption of light in the vicinity of the laser beam-emitting end faces.

Since the current non-injection regions are formed without using the technique such as the proton injection method, the occurrence of defects in crystals of the semiconductor laser device can be prevented.

In the current non-injection regions B, the oxygen concentration (about $3\times10^{20}$ $cm^{-3}$) of the oxide layer 106A formed at the interface between the p-type GaInP intermediate band gap layer 106 and the p-type AlGaAs contact layer 125 is higher than the oxygen concentration (about $1.0\times10^{18}$ $cm^{-3}$) at the interface between the p-type GaInP intermediate band gap layer 106 and the p-type AlGaAs cap layer 107 in the current injection region A, as well as the oxygen concentration (about $3.0\times10^{18}$ $cm^{-3}$) at the interface between the p-type AlGaAs cap layer 107 and the p-type AlGaAs contact layer 125. Therefore, a flow of current at the interface between the p-type GaInP intermediate band gap layer 106 and the p-type AlGaAs contact layer 125 in the current non-injection region B is smaller than that at the interface between the p-type AlGaAs cap layer 107 and the p-type AlGaAs contact layer 125 and that at the interface between the p-type GaInp intermediate band gap layer 106 and the p-type AlGaAs cap layer 107 in the current injection region A. Accordingly, the flow of current at the interface between the p-type GaInP intermediate band gap layer 106 and the p-type AlGaAs contact layer 125 in the current non-injection regions can surely be blocked, thus making it possible to achieve the high current non-injection effect.

Since the oxygen concentration of the oxide layers 106A formed at the interface between the p-type GaInP intermediate band gap layer and the p-type AlGaAs contact layer in the current injection region A is $1\times10^{20}$ $cm^{-3}$ or more (in this embodiment, about $3.0\times10^{20}$ $cm^{-3}$), it is possible to sufficiently prevent an electric current from flowing through the current non-injection regions B, as shown in FIG. 5, meaning that the sufficient current non-injection effect is obtained.

The oxygen concentration (about $1.0\times10^{18}$ $cm^{-3}$ in the embodiment) at the interface between the p-type GaInP intermediate band gap layer 106 and the p-type AlGaAs cap layer 107 in the current injection region A is set to not more than $1\times10^{19}$ $cm^{-3}$, and the oxygen concentration (about $3.0\times10^{18}$ $cm^{-3}$ in the embodiment) at the interface between the p-type AlGaAs cap layer 107 and the p-type AlGaAs contact layer 125 in the current injection region A is also set to not more than $1\times10^{19}$ $cm^{-3}$. Thus, as shown in FIG. 5, the above two interfaces do not block an electric current passing through the current injection region A. Therefore, it is possible to supply sufficient current to the current injection region A, where supply of current is required for generating laser beams.

Intermixing of the active layer is performed at portions corresponding to the current non-injection regions B to form the window regions 102B having a large band gap energy. Thus, the maximum output power of laser beams can be improved. At the same time, switching of the current/optical output characteristics, which would occur when only the current non-injection structure is used without providing any window regions, can be prevented, and also increase of noise at the time of the operation at a low output can be prevented. Therefore, the semiconductor laser device of the first embodiment can be applied as a semiconductor laser device for optical discs that can perform both low- and high-output operations. In the semiconductor laser device of the first embodiment, the whole regions in the active layer 102 corresponding to the current non-injection regions B were intermixed. However, alternatively, the intermixing may be performed only in a part of each of the regions of the active layer 102 corresponding to the current non-injection regions B, which part is located closer to the respective laser beam-emitting end faces (i.e., the laser beam-emitting surface and the laser beam-reflecting surface). Also, the intermixed portion may include, in addition to the whole area corresponding to the current non-injection region B of the active layer 102, an area of the active layer 102 corresponding to a part of the current injection region A immediately adjacent the current non-injection region B.

According to the method for producing a semiconductor laser device of the first embodiment, in the oxide layer forming process after the cap layer removing process, the oxide layers 106A are formed on the surface of the p-type GaInP intermediate band gap layer 106 which has been exposed by the cap layer removing process, whereby the current non-injection regions B can appropriately be formed. Therefore, the oxide layers 106A surely prevent a current from flowing through the current non-injection regions B, thus making it possible to secure favorable current non-injection characteristics in the current non-injection regions B.

In the current injection region A where the cap layer 107 has not been removed in the cap layer removing process, a continuously grown favorable interface is formed so that a current can flow through the current injection region A at a low voltage. Therefore, favorable current injection characteristics in the current injection region A can be secured.

Since the p-type AlGaAs contact layer 125 is formed by the MBE method, reducing gas such as hydrogen is not used. Thus, removal of the oxide layers 106A in the current non-injection regions B by the reducing effect of hydrogen and so on does not take place. Even in a state in which the temperature of the n-type GaAs substrate 100 is low, the oxide layers 106A can surely be formed on the surfaces of the current non-injection regions B.

Before forming the p-type AlGaAs contact layer 125 by the molecular beam epitaxy method, the exposed surface portions of the p-type GaInP intermediate band gap layer 106 are oxidized using a solution containing hydrogen peroxide. Thus, the oxide layer 106A can be formed with a simple treatment of immersion of the p-type GaInP intermediate band gap layer into the liquid, meaning that the current non-injection regions B are surely realized.

In the method for producing a semiconductor laser device of the first embodiment, removal of the p-type GaAs cap layer and oxidation of the surface of the p-type GaInP intermediate band gap layer 106 are performed using a mixed solution in which ammonia, hydrogen peroxide and water are mixed, with the etching time being 30 seconds. Alternatively, if etching is performed using a mixed solution in which sulfuric acid, hydrogen peroxide and water are mixed, similar results can be obtained (although, when the mixing ratio of sulfuric acid, hydrogen peroxide and water is for example 1:8:8 and the temperature of the mixed solution is set to 20° C., an etching time of two minutes is required).

The etching process using the mixed solution containing ammonia, hydrogen peroxide and water was performed for 30 seconds for the removal of the p-type GaAs cap layer 107 and the oxidation of the surfaces of the p-type GaInP intermediate band gap layer 106. The etching time may be relatively long such that the immersion of the intermediate band gap layer in the solution continues even after removing the p-type GaAs cap layer 107 (for example, in the case where the mixing ratio of ammonia and hydrogen peroxide and water is 20:30:50, and the temperature of the mixed solution is 20° C., the etching time may be three minutes). In this case, the oxide layers can surely be formed.

Film-forming conditions by the MBE with regard to the contact layer in the method for producing a semiconductor laser device of the first embodiment can be changed by raising the temperature of the n-type GaAs substrate. However, in this case, in order to maintain the sufficient current non-injection effect, oxygen may be produced by ultraviolet rays to oxidize the surface of the p-type GaInP intermediate band gap layer. Alternatively, plasma-like oxygen ions or activated oxygen (oxygen radical) may be used to oxidize the surface of the p-type GaInP intermediate band gap layer. Furthermore, the oxidation of the surface of the p-type GaInP intermediate band gap layer may be conducted by setting the substrate temperature to as high as 400° C.–600° C., as well as by using water vapor.

In the method for producing a semiconductor laser device of the first embodiment, the MBE method was used as the method of forming the contact layer 125. The reason therefor is as follows. In the MBE method, reducing hydrogen gas is not used, and the temperature of the n-type GaAs substrate 100 is relatively low (not more than 650° C.) and thus the oxide layers 106A formed in the current non-injection regions B are hard to remove.

Second Embodiment

FIG. 6A through FIG. 7C are perspective views showing a process for producing a semiconductor laser device according to a second embodiment of the present invention. It should be noted that these figures show only a part corresponding to a single chip of the entire wafer for the sake of convenience.

The semiconductor laser device according to the second embodiment and the method for producing the same will be described below.

In the method for producing a semiconductor laser device according to the second embodiment, a metal-organic chemical vapor deposition (MOCVD) method is used for growing a p-type AlGaAs contact layer. In the MOCVD method, the p-type AlGaAs contact layer is exposed to a reducing atmosphere of hydrogen and the substrate temperature is raised and thus the action of removing oxide layers becomes stronger. However, in the producing method of the second embodiment, the process for forming the oxide layer consists of two steps. Namely, in addition to the process using a hydrogen peroxide solution as a first step, which is also carried out in the method of the first embodiment, a process using ozone as a second step is performed so that a sufficient current injection effect can be obtained.

The method of producing the semiconductor laser device according to the second embodiment will be described below step by step.

Figure 6A:
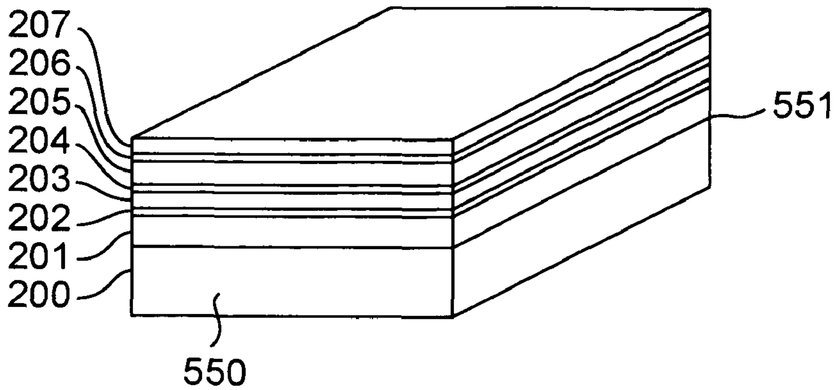
FIGS. 6A–6C are views for explaining a method for producing a semiconductor laser device according to a second embodiment of the present invention.

First, as shown in FIG. 6A, an n-type $(Al_{0.7}Ga_{0.3})_{0.5}In_{0.5}P$ lower cladding layer 201 (having a thickness of 1.5 $\mu$m and a carrier concentration of $0.7\times10^{18}$ cm$^{-3}$), an active layer 202 consisting of four undoped $(Al_{0.5}Ga_{0.5})_{0.5}In_{0.5}P$ layers and three undoped GaInP layers (having a thickness of 6 nm) respectively interposed between the adjacent undoped $(Al_{0.5}Ga_{0.5})_{0.5}In_{0.5}P$ layers, a p-type $(Al_{0.7}Ga_{0.3})_{0.5}In_{0.5}P$ first upper cladding layer 203 (having a thickness of 0.2 $\mu$m, and a carrier concentration of $0.8\times10^{18}$ $cm^{-3}$), a p-type $Ga_{0.6}In_{0.4}P$ etching stopper layer 204 (having a thickness of 8 nm, and a carrier concentration of $0.8\times10^{18}$ $cm^{-3}$), a p-type $(Al_{0.7}Ga_{0.3})_{0.5}n_{0.5}P$ second upper cladding layer 205 (having a thickness of 0.8 μm, and a carrier concentration of $1.0\times10^{18}$ $cm^{-3}$), a p-type $(Al_{0.1}Ga_{0.9})_{0.5}In_{0.5}P$ intermediate band gap layer 206 (having a thickness of 0.1 μm, and a carrier concentration of $2\times10^{18}$ $cm^{-3}$), and a p-type GaAs cap layer 207 (having a thickness of 0.3 μm, and a carrier concentration of $2\times10^{18}$ $cm^{-3}$) are formed in this order on an n-type GaAs substrate 200 by the MOCVD method. The process of forming the p-type $(Al_{0.1}Ga_{0.9})_{0.5}In_{0.5}P$ intermediate band gap layer 206 and the p-type GaAs cap layer 207 on the p-type $(Al_{0.7}Ga_{0.3})_{0.5}$ $In_{0.5}P$ second upper cladding layer 205 is one example of the intermediate band gap layer and cap layer forming process. In the semiconductor laser device according to this second embodiment, n-type dopant is Si, and p-type dopant is Zn.

Figure 6B:
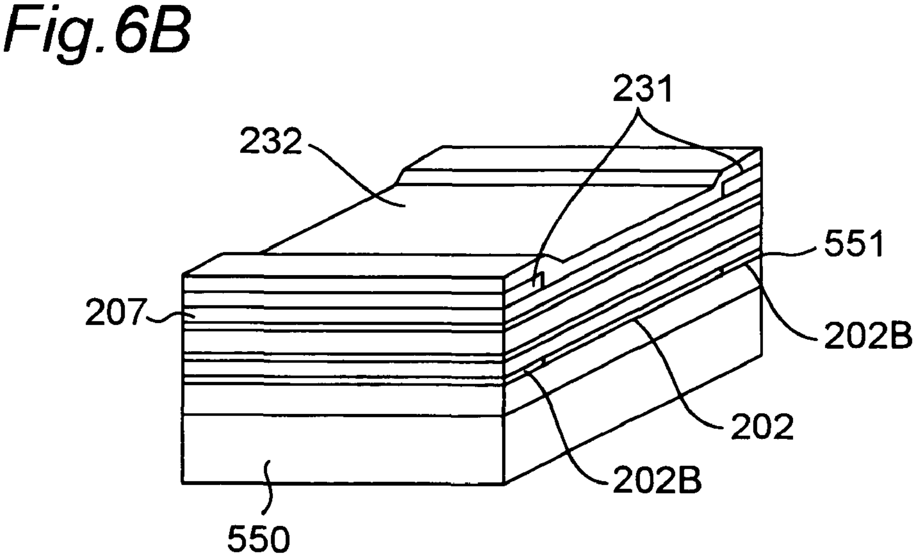

Next, as shown in FIG. 6B, ZnO (zinc oxide) layers 231 are formed in stripe shapes along regions forming laser beam-emitting end faces 550, 551 on the cap layer 207, and a $SiO_2$ layer 232 is formed on the entire regions of the cap layer 207 and the ZnO layers 231.

Then, annealing is performed at 520° C. for 2 hours, so that Zn is diffused from the ZnO layers 231 to regions of the cap layer 207 and the upper cladding layer 205 on the sides of the laser beam-emitting end faces 550, 551. Thereby, the quantum well layers and the barrier layers of the active layer 202 under the ZnO layers 231 are intermixed to form window regions 202B of the active layer 202.

Figure 6C:
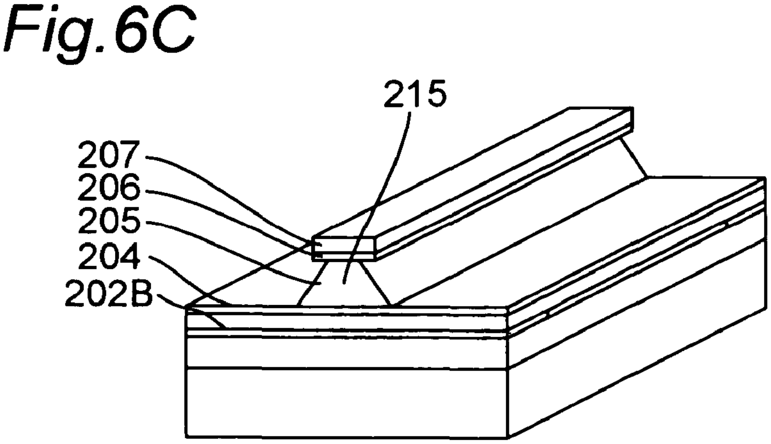

Subsequently, as shown in FIG. 6C, after the $SiO_2$ layer 232 and the ZnO layers 231 are removed using a buffered hydrofluoric acid, the p-type GaAs cap layer 207, the p-type GaInP intermediate band gap layer 206 and the p-type $(Al_{0.7}Ga_{0.3})_{0.5}In_{0.5}P$ second upper cladding layer 205 are etched in a stripe shape until the etching stopper layer 204 is exposed, whereby a ridge stripe 215 is formed.

Figure 7A:
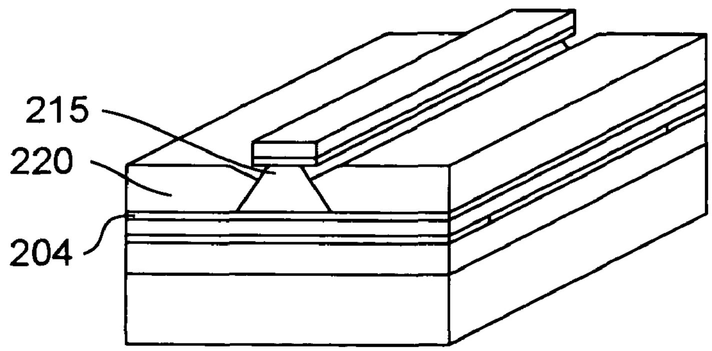
FIGS. 7A–7C are views for explaining the method for producing the semiconductor laser device, showing process steps following a step shown in FIG. 6C.

Next, as shown in FIG. 7A, an n-type $Al_{0.5}In_{0.5}sP$ current blocking layer 220 is formed on the etching stopper layer 204 by the MOCVD method in a manner so as to be in contact with side surfaces of the ridge stripe portion 215.

Figure 7B:
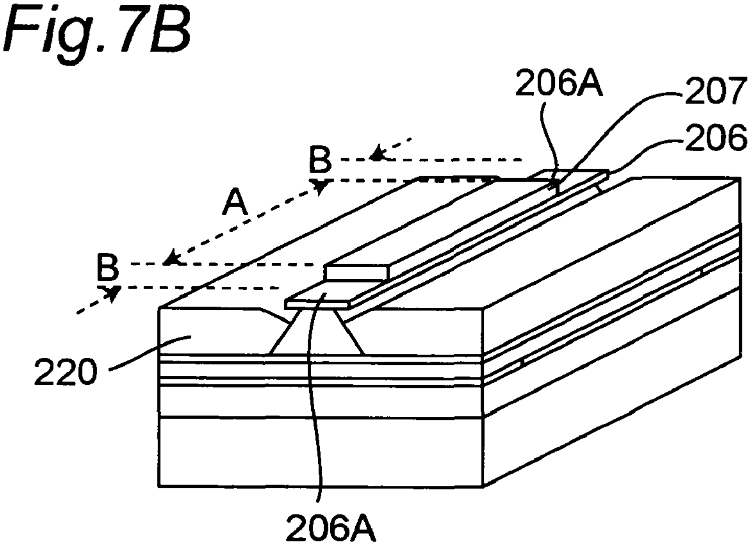

Then, as shown in FIG. 7B, a cap layer removing process and an oxide layer forming process are conducted. Different from the method for producing the semiconductor laser device of the first embodiment, in the method for producing the semiconductor laser device of the second embodiment, the oxide layer forming process consists of two steps. Specifically, current injection region A (a region at a distance away from both the emitting end faces) is covered by a resist (not shown), and current non-injection regions B (regions on the sides of the emitting end faces, which continue to the current injection region A) are subjected to etching for 30 seconds with a mixed solution containing ammonia, aqueous hydrogen peroxide and water at a ratio of 20:30:50 and having a temperature of 20° C., whereby portions of the p-type GaAs cap layer 207 in the current non-injection regions B are removed. The process of removing the p-type GaAs cap layer 207 in the current non-injection regions B is an example of the cap layer removing process. When performing the cap layer removing process, a surface of the p-type $(Al_{0.1}Ga_{0.9})_{0.5}In_{0.5}P$ intermediate band gap layer 206, which is exposed due to removal of the portions of the p-type GaAs cap layer 207 not having been covered, is not etched, but is oxidized due to the action of hydrogen peroxide solution. Thereby, the oxide layer 206A is partially formed on the exposed surface of the p-type AlGaInP intermediate band gap layer 206. The process of partially forming the oxide layers 206A serves as the first step in the oxide layer forming process. In the cap layer removing process and the first step of the oxide layer forming process, the n-type $Al_{0.5}In_{0.50.5}P$ current blocking layers 220 are not etched by the etchant and thus their shapes are retained.

In the method according to the second embodiment, after the cap layer removing process and the first step in the oxide layer-forming process, by using an apparatus that generates ozone by irradiation of ultraviolet rays in an atmosphere of oxygen, the entire surface of the wafer is exposed to an ozone atmosphere for one hour so as to be oxidized. Thereafter, the current non-injection regions B are covered by resist, and the oxide layer in the current injection region A is removed with a mixed solution of sulfuric acid, hydrogen peroxide water and water. The process of exposing the entire surface of the wafer for one hour so as to oxidize it using the apparatus that generates ozone serves as the second step of the oxide layer forming process. Thus, the oxide layer 206A is formed on the exposed surface of the p-type AlGaInP intermediate band gap layer 206 by the two-step oxide layer forming process.

Figure 7C:
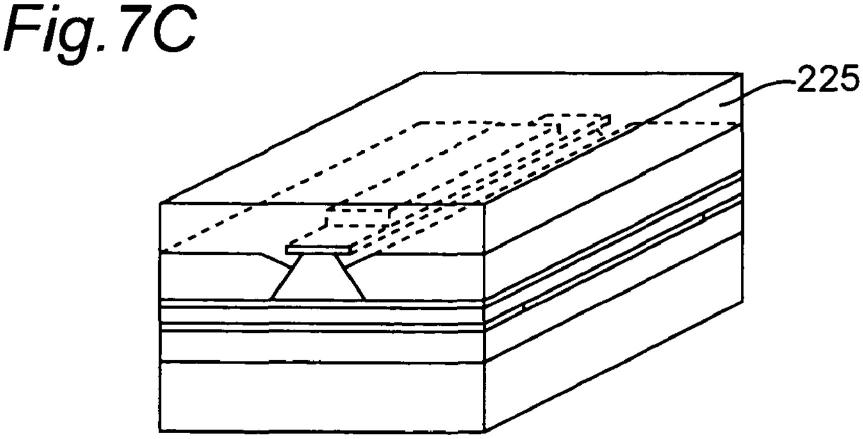

Thereafter, a contact layer forming process of the second embodiment shown in FIG. 7C is conducted. That is, a p-type GaAs contact layer 225 (having a thickness of 4 μm) is formed on the entire surface of the semiconductor laser wafer by a low-pressure MOCVD method. Hydrogen is used as a carrier gas and TMGa (trimethyl gallium) and $AsH_3$ (arsine) are used as sources. At this time, the substrate temperature is 700° C. At this substrate temperature, oxygen on the p-type GaInP intermediate band gap layer 206 is removed to a certain extent. However, because the second step of the oxide layer forming process using the ozone treatment has been conducted, as described above, the oxide layers 206A keep an oxygen concentration of about $1\times10^{20}$ $cm^{-3}$ showing favorable current non-injection characteristics.

Figure 8:
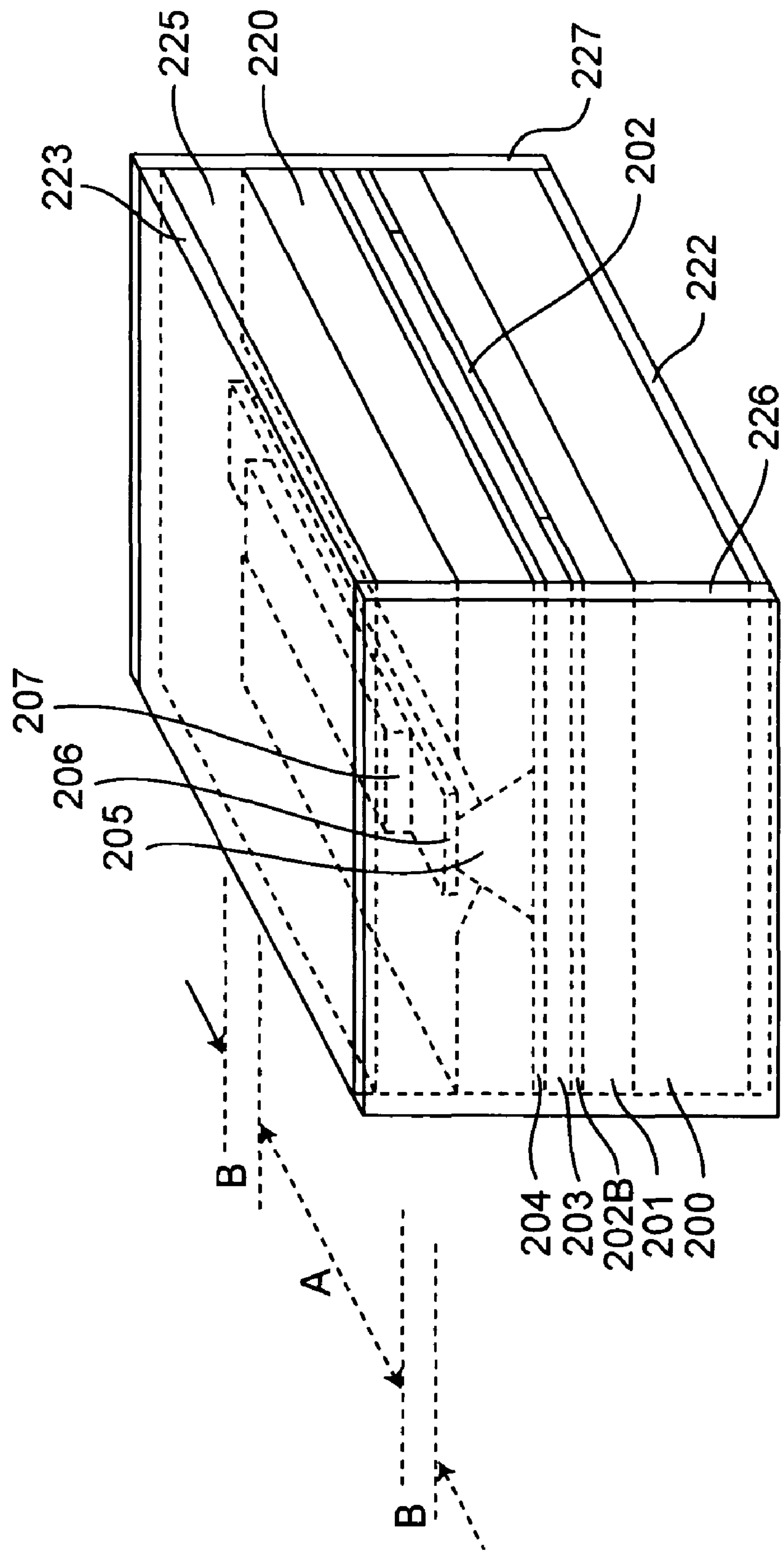
FIG. 8 is a perspective view of the semiconductor laser device produced by the method according to the second embodiment of the present invention.

Lastly, as shown in FIG. 8, an n-side electrode 222 and a p-side electrode 223 are formed, and the wafer formed with these electrodes is cleaved at window regions so as to have a resonator length of 900 μm. A laser beam-emitting end face is coated with a low-reflectivity reflection coating 226 with a reflectivity of about 6%, while the end face opposite from the laser beam-emitting end face is coated with a high-reflectivity reflection coating 227 with a reflectivity of about 90% to complete the semiconductor laser device according to the second embodiment. In FIG. 8, the same layers as those in FIGS. 6 and 7 are designated by the same reference numerals.

Figure 9:
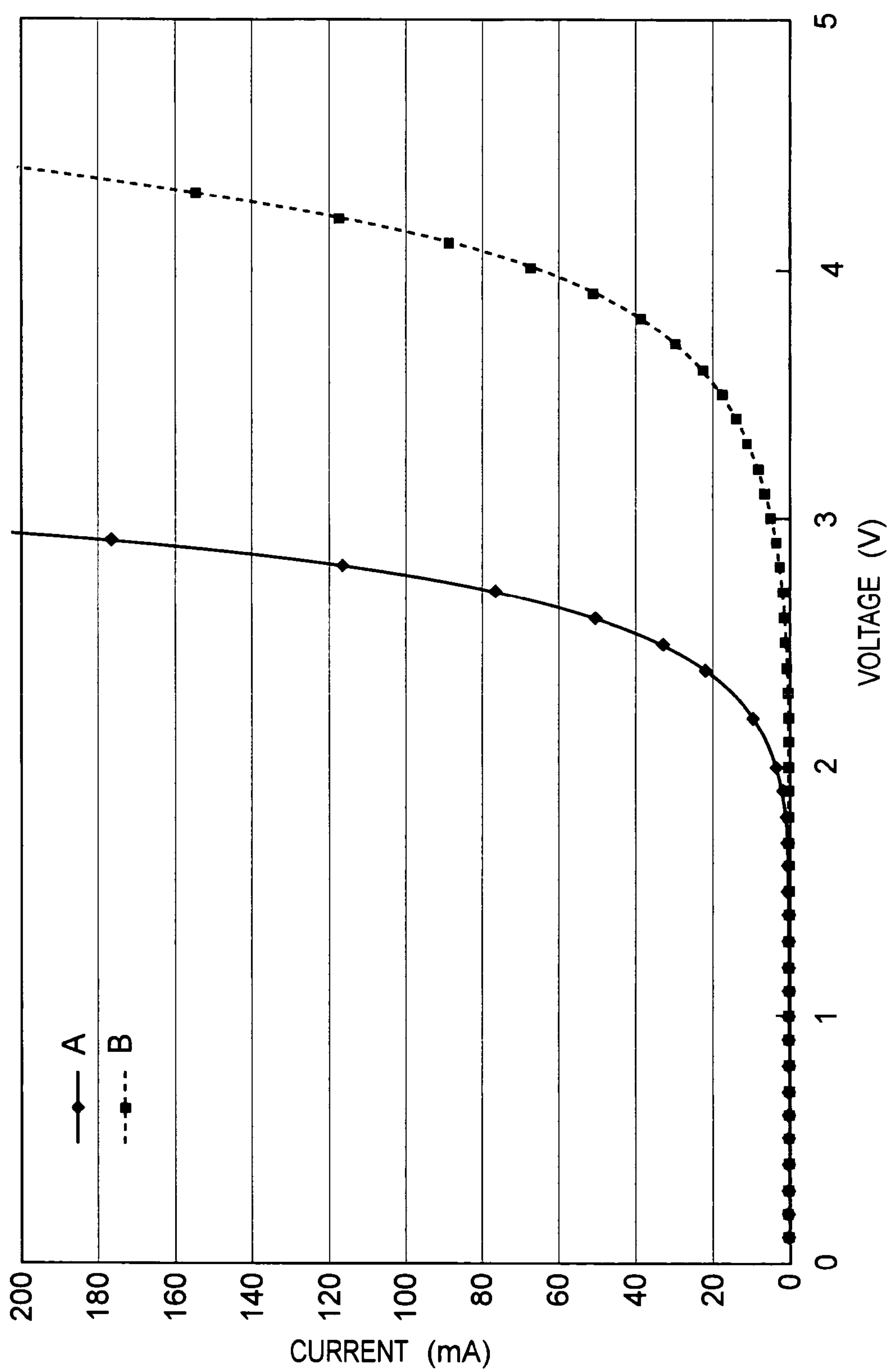
FIG. 9 is a graph showing the voltage-current characteristics of the semiconductor laser device according to the second embodiment.
Figure 10A:
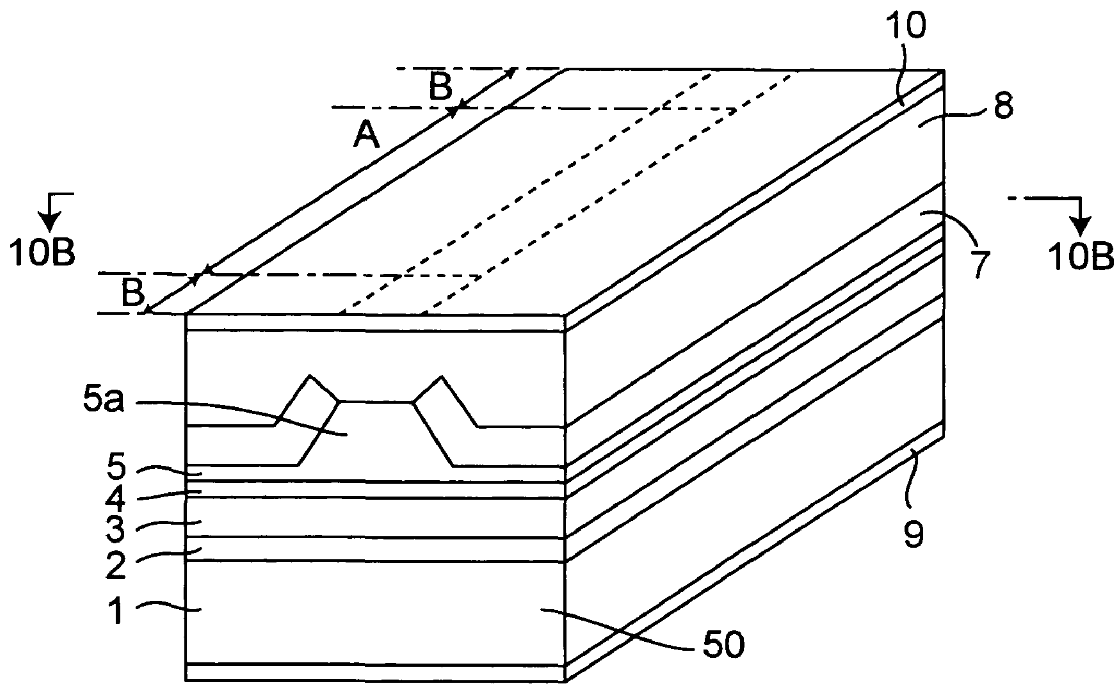
FIG. 10A is a perspective view of a first conventional semiconductor laser device.
Figure 10B:
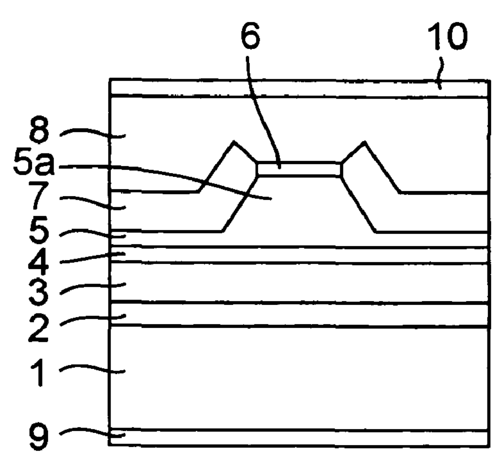
FIG. 10B is a cross-sectional view taken along line 10B—10B of FIG. 10A.
Figure 11:
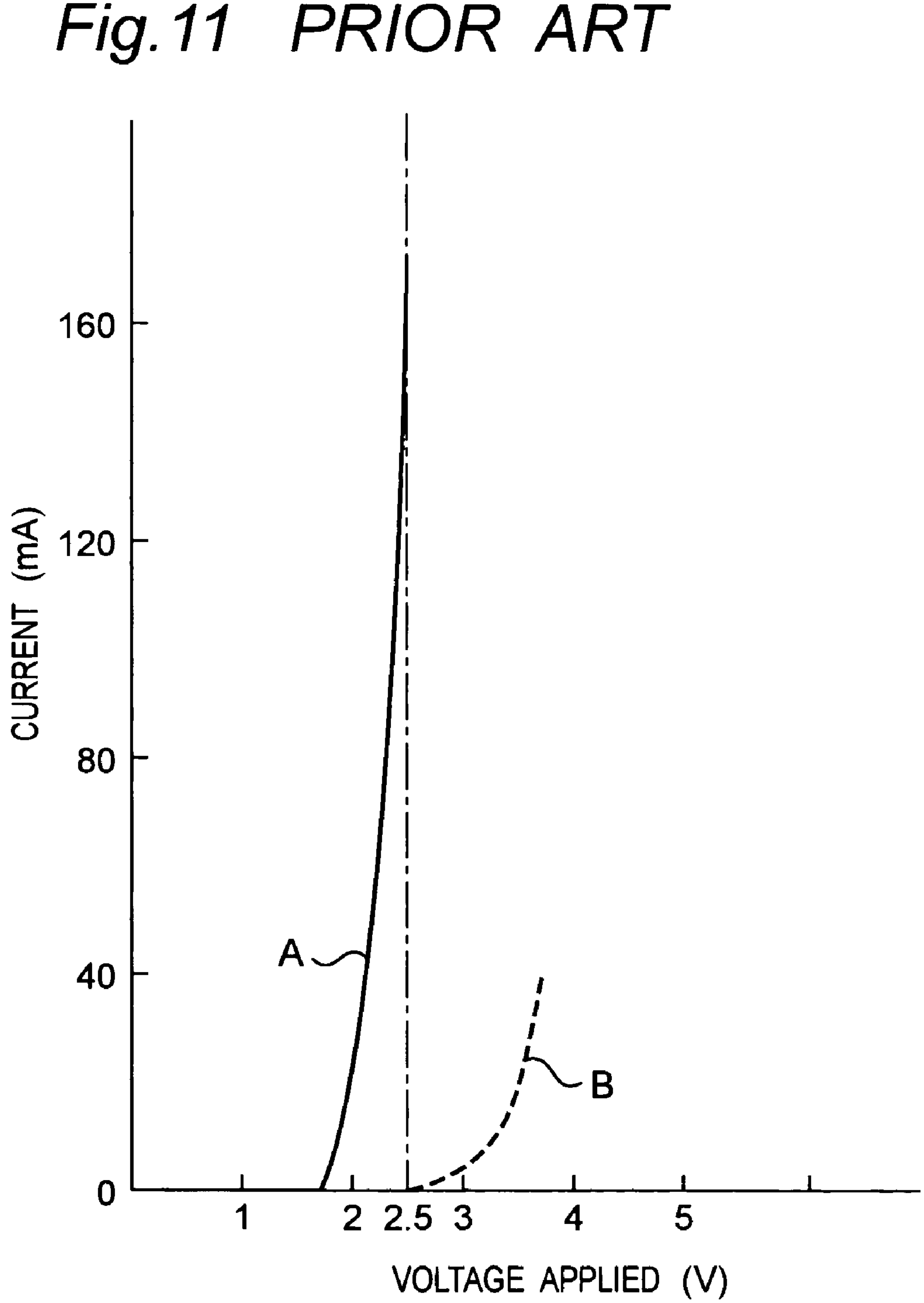
FIG. 11 is a graph showing the voltage-current characteristics of the first semiconductor laser device.
Figure 12A:
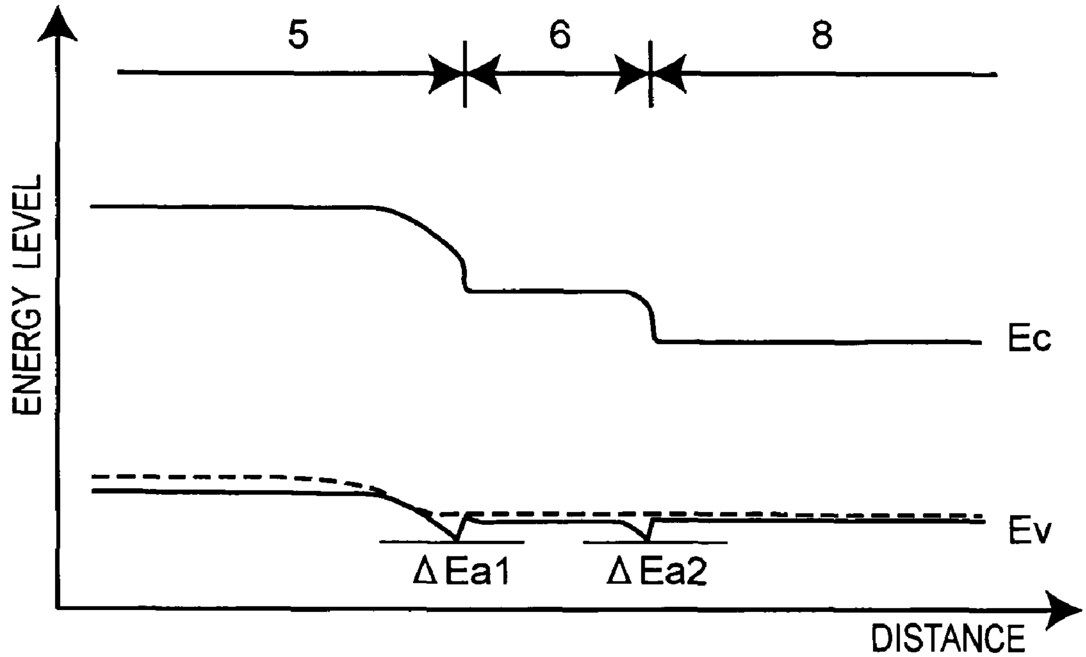
FIGS. 12A and 12B are diagrams for explaining that a current hardly flows at a junction interface between semiconductor layers.
Figure 12B:
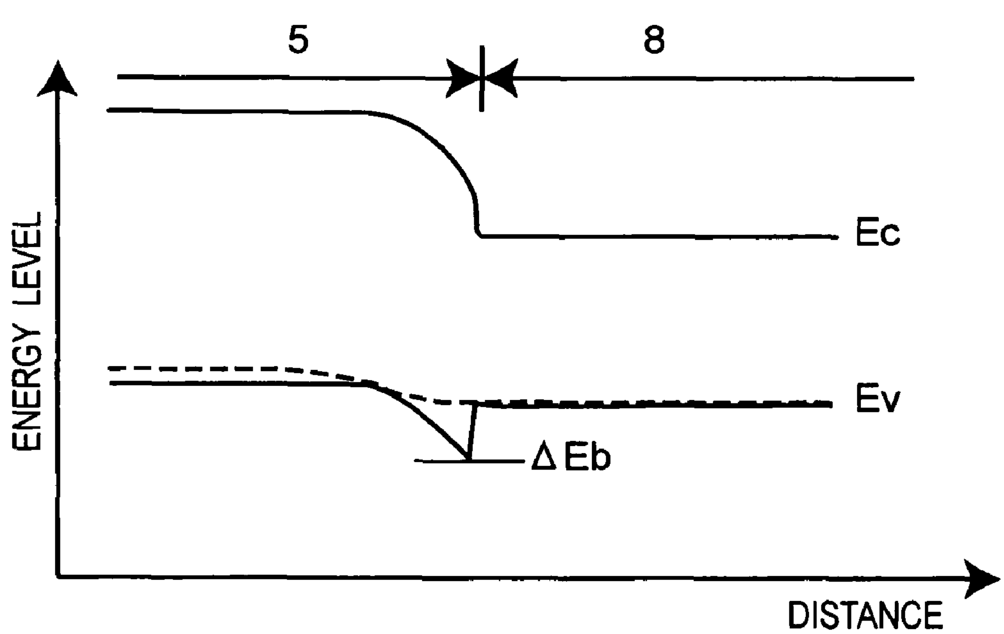
Figure 13A:
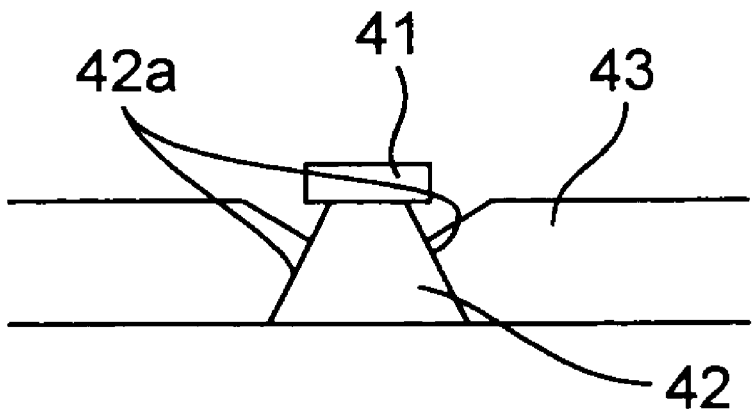
FIG. 13A and FIG. 13B are schematic cross-sectional views of a current non-injection region of the first semiconductor laser device.
Figure 13B:
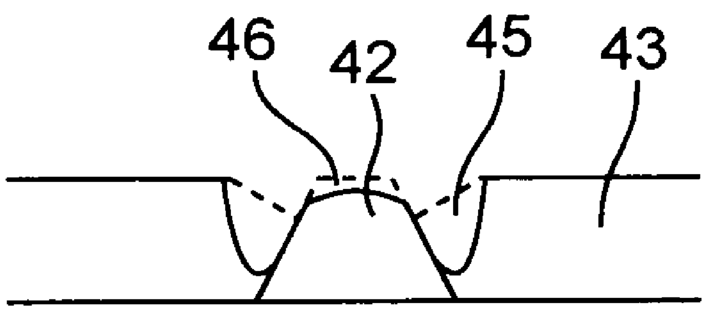
Figure 14:
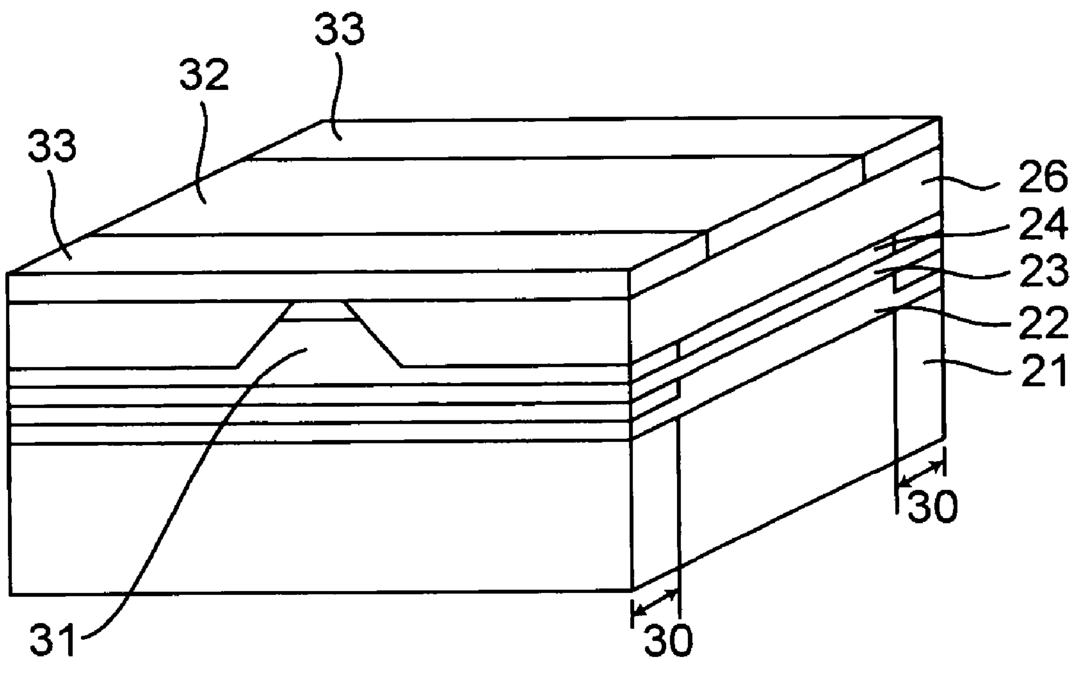
FIG. 14 is a perspective view of a second conventional semiconductor laser device.

In order to confirm the effect of the current non-injection structure of the semiconductor laser device, in the same manner as in the first embodiment, a semiconductor laser device in which a 900 μm long resonator is entirely made of only the current injection region A, and a semiconductor laser device in which a 900 μm long resonator is entirely made of only the current non-injection region B were fabricated and the voltage-current characteristics of these semiconductor laser devices were measured. FIG. 9 shows the voltage-current characteristics of these semiconductor laser devices.

As shown in FIG. 9, according to the second embodiment, similarly to the first embodiment, the semiconductor laser device which is made of only the current injection region A, which is shown in solid line in FIG. 9, has favorable current injection characteristics, while the semiconductor laser device which is made of only the current non-injection region B, which is shown in dotted line in FIG. 9, has favorable current non-injection characteristics.

According to the semiconductor laser device of the second embodiment, different from the semiconductor laser device of the first embodiment, the composition of the intermediate band gap layer is set to $(Al_{0.1}Ga_{0.9})_{0.5}In_{0.5}P$. The reason therefor is that, by adding an Al constituent, oxidation of the surface of the intermediate band gap layer 206 is promoted so that the oxide layer 206A is stably formed even if reducing film formation by the MOCVD is used. The intermediate band gap layer is required to have a band gap intermediate between the p-type cladding layer and the p-type cap layer. Thus, if the Al molar fraction is set to too high, current injection in the current injection region A is hampered, which is not preferred. The Al molar fraction is preferably set to not more than 0.4, more preferably, not more than 0.1.

In the method for producing a semiconductor laser device of the second embodiment, the p-type AlGaAs contact layer 225 is formed by the MOCVD method that uses hydrogen, which is a reducing gas. In spite of use of the MOCVD method, sufficient oxide is secured by combining a surface oxidation process using a hydrogen peroxide solution and so on with the MOCVD process, or by changing the conditions (the substrate temperature, etc.) for the MOCVD. Thereby, the sufficient current non-injection structure can be formed in the current non-injection regions B.

In the method for producing the semiconductor laser device according to the second embodiment, the surface oxidation using hydrogen peroxide was used in combination with the surface oxidation using ozone, but they are not necessarily used together.

In the method for producing the semiconductor laser device according to the second embodiment, ozone was generated using ultraviolet rays so as to conduct surface oxidation, but the surface oxidation may be conducted using plasma-like oxygen ion or activated oxygen (oxygen radical).

In the method for producing the semiconductor laser device according to the second embodiment, to oxidize the surface of the intermediate band gap layer, a process of generating oxygen ion with ultraviolet rays was employed. Alternatively, a process may be employed in which the substrate temperature is set to 400° C.–600° C. and water vapor is used.

In the first and second embodiments, the current non-injection regions are formed at and near the respective laser-beam emitting end faces. However, it will readily be understood that the present invention is also applicable even when the current non-injection is formed in a location other than the vicinity of the laser-beam emitting end faces.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device wherein an n-type $(Al_eGa_{1-e})_fIn_{1-f}P$ ($0 \leqq e \leqq 1$, $0 \leqq f \leqq 1$) cladding layer, an active layer comprising a plurality of stacked layers of AlGaInP type material, a p-type $(Al_xGa_{1-x})_yIn_{1-y}P$ ($0 \leqq x \leqq 1$, $0 \leqq y \leqq 1$) cladding layer, and a p-type $(Al_pGa_{1-p})_qIn_{1-q}P$ ($0 \leqq p \leqq 1$) $0 \leqq q \leqq 1$) intermediate band gap layer are stacked in this order on a substrate, the semiconductor laser device having a current injection region and a current non-injection region, wherein the semiconductor laser device further comprises:

an oxide layer formed on a surface of the p-type $(Al_pGa_{1-p})_qIn_{1-q}P$ intermediate band gap layer in the current non-injection region;

a p-type $Al_uGa_{1-u}As$ ($0 \leqq u \leqq 1$) cap layer formed on the p-type $(Al_pGa_{1-p})_qIn_{1-q}P$ intermediate band gap layer in the current injection region; and a p-type $Al_vGa_{1-v}As$ ($0 \leqq v \leqq 1$) contact layer formed on the oxide layer and the p-type $Al_uGa_{1-u}As$ cap layer.

2. The semiconductor laser device according to claim 1, wherein the oxide layer has an oxygen concentration that is higher than an oxygen concentration at an interface between the p-type $(Al_pGa_{1-p})_qIn_{1-q}P$ intermediate band gap layer in the current injection region and the p-type $(Al_uGa_{1-u})As$ cap layer and that is also higher than an oxygen concentration at an interface between the p-type $(Al_uGa_{1-u})As$ cap layer and the p-type $Al_vGa_{1-v}As$ contact layer.

3. The semiconductor laser device according to claim 1, wherein the oxide layer has an oxygen concentration of $1 \times 10^{20}\ cm^{-3}$ or more.

4. The semiconductor laser device according to claim 1, wherein an oxygen concentration at an interface between the p-type $(Al_pGa_{1-p})_qIn_{1-q}P$ intermediate band gap layer in the current injection region and the p-type $(Al_uGa_{1-u})As$ cap layer, and an oxygen concentration at an interface between the p-type $(Al_uGa_{1-u})As$ cap layer and the p-type $Al_vGa_{1-v}As$ contact layer are not more than $10 \times 10^{19}\ cm^{-3}$.

5. The semiconductor laser device according to claim 1, wherein the p-type $(Al_pGa_{1-p})_qIn_{1-q}P$ intermediate band gap layer satisfies a condition of $0<p \leqq 0.1$.

6. The semiconductor laser device according to claim 1, wherein the current non-injection region is located closer to a laser-beam emitting end face than the current injection region is.

7. The semiconductor laser device according to claim 6, wherein a region of the active layer corresponding to the current non-injection region is intermixed at least at a portion on the side of the laser beam-emitting end face.

8. A method for producing the semiconductor laser device of claim 1, comprising:

an intermediate band gap layer and cap layer forming process that sequentially forms a p-type $(Al_pGa_{1-p})_q In_{1-q}\ P$ ($0 \leqq p \leqq 1$) $0 \leqq q \leqq 1$) intermediate band gap layer and a p-type $(Al_uGa_{1-u})As$ ($0 \leqq u \leqq 1$) cap layer in a film-forming apparatus;

a cap layer removing process that, after performing the intermediate band gap layer and cap layer forming process, partially removes the p-type $(Al_uGa_{1-u})As$ cap layer in order to form a current non-injection region;

an oxide layer forming process that forms an oxide layer at a surface of the p-type $(Al_pGa_{1-p})_qIn_{1-q}P$ intermediate band gap layer exposed due to the partial removal of the p-type $(Al_uGa_{1-u})As$ ($0 \leqq u \leqq 1$) cap layer in the cap layer removing process; and a contact layer forming process that forms a p-type $Al_vGa_{1-v}As$ ($0 \leqq v \leqq 1$) contact layer on the p-type $(Al_uGa_{1-u})As$ cap layer remaining without being removed in the cap layer removing process and on the oxide layer formed in the oxide layer forming process.

9. The method for producing the semiconductor laser device according to claim 8, wherein the p-type $Al_vGa_{1-v}As$ contact layer is formed by molecular beam epitaxy.

10. The method for producing the semiconductor laser device according to claim 9, wherein, before forming the p-type $AlGa_vGa_{1-v}As$ contact layer, the surface of the p-type $(Al_pGa_{1-p})^qIn_{1-q}P$ intermediate band gap layer is oxidized using a solution containing hydrogen peroxide.

11. The method for producing the semiconductor laser device according to claim 9, wherein, before forming the p-type $Al_vGa_{1-v}As$ contact layer, the surface of the p-type $(Al_pGa_{1-p})_qIn_{1-q}P$ intermediate band gap layer is oxidized by being exposed to an atmosphere of at least one of ozone, oxygen ion or activated oxygen.

12. The method for producing the semiconductor laser device according to claim 9, wherein, before forming the p-type $Al_vGa^{1-v}As$ contact layer, the surface of the p-type $(Al_pGa_{1-p})_qIn_{1-q}P$ intermediate band gap layer is oxidized by being exposed to a gas containing water vapor.

13. The method for producing the semiconductor laser device according to claim 8, wherein the p-type $Al_vGa_{1-v}As$ contact layer is formed by metal-organic chemical vapor deposition method.

14. The method for producing the semiconductor laser device according to claim 13, wherein, before forming the p-type $Al_vGa_{1-v}As$ contact layer, the surface of the p-type $(Al_pGa_{1-p})_qIn_{1-q}P$ intermediate band gap layer is oxidized using a solution containing hydrogen peroxide.

15. The method for producing the semiconductor laser device according to claim 13, wherein, before forming the p-type $Al_vGa_{1-v}As$ contact layer, the surface of the p-type $(Al_pGa_{1-p})_qIn_{1-q}P$ intermediate band gap layer is oxidized by being exposed to an atmosphere of at least one of ozone, oxygen ion or activated oxygen.

16. The method for producing the semiconductor laser device according to claim 13, wherein, before forming the p-type $Al_vGa_{1-v}As$ contact layer, the surface of the p-type $(Al_pGa_{1-p})_qIn_{1-q}P$ intermediate band gap layer is oxidized by being exposed to a gas containing water vapor.

* * * * *